United States Patent
Jones et al.

(10) Patent No.: US 9,111,860 B2
(45) Date of Patent: Aug. 18, 2015

(54) ION IMPLANTATION SYSTEM AND METHOD

(71) Applicant: Advanced Technology Materials, Inc., Danbury, CT (US)

(72) Inventors: Edward E. Jones, Woodbury, CT (US); Sharad N. Yedave, Danbury, CT (US); Ying Tang, Brookfield, CT (US); Barry Lewis Chambers, Midlothian, VA (US); Robert Kaim, Brookline, MA (US); Joseph D. Sweeney, New Milford, CT (US); Oleg Byl, Southbury, CT (US); Peng Zou, Ridgefield, CT (US)

(73) Assignee: ENTEGRIS, INC., Billerica, MA (US)

(*) Notice: Subject to any disclaimer, the term of this patent is extended or adjusted under 35 U.S.C. 154(b) by 0 days.

(21) Appl. No.: 14/452,192

(22) Filed: Aug. 5, 2014

(65) Prior Publication Data

US 2014/0342538 A1    Nov. 20, 2014

Related U.S. Application Data

(63) Continuation of application No. 13/502,855, filed as application No. PCT/US2010/053977 on Oct. 25, 2010, now Pat. No. 8,796,131.

(60) Provisional application No. 61/255,097, filed on Oct. 27, 2009, provisional application No. 61/358,514, filed on Jun. 25, 2010, provisional application No. 61/349,202, filed on May 27, 2010.

(51) Int. Cl.
*H01L 21/26* (2006.01)
*H01L 21/42* (2006.01)
(Continued)

(52) U.S. Cl.
CPC .............. *H01L 21/265* (2013.01); *C23C 14/48* (2013.01); *C23C 14/52* (2013.01); *H01J 37/08* (2013.01); *H01J 37/3171* (2013.01); *H01J 2237/006* (2013.01); *H01J 2237/022* (2013.01)

(58) Field of Classification Search
CPC ................ H01L 21/265; H01L 21/046; H01L 21/02126; H01L 21/02444; H01L 21/0262; H01L 21/02667; H01L 21/0455; H01L 21/2822; H01L 21/041; H01L 21/0257; H01L 21/0415; H01L 21/02672; H01L 51/008; B23K 26/043; B23K 26/18; C30B 31/12; C30B 23/063
USPC ......... 438/510, 513, 515, 502, 508, 509, 514, 438/535; 257/56, 148, 428, 682, E21.043, 257/E21.077, E21.135, E21.138, E21.141, 257/E21.227, E21.248, E21.262, E21.264, 257/E21.311, E21.347, E21.517
See application file for complete search history.

(56) References Cited

U.S. PATENT DOCUMENTS 3,893,769 A    7/1975 Woolley
(Continued)

FOREIGN PATENT DOCUMENTS

CN    1980940 A    6/2007
(Continued)

OTHER PUBLICATIONS

Timms, P., "Boron-Fluorine Chemistry. I. Boron Monofluoride and Some Derivatives", "Journal of the American Chemical Society", Mar. 29, 1967, pp. 1629-1632, vol. 89, No. 7.
(Continued)

*Primary Examiner* — David Nhu
(74) *Attorney, Agent, or Firm* — Hulquist, PLLC; Steven J. Hulquist; Rosa Yaghmour

(57) ABSTRACT

An ion implantation system and method, providing cooling of dopant gas in the dopant gas feed line, to combat heating and decomposition of the dopant gas by arc chamber heat generation, e.g., using boron source materials such as $B_2F_4$ or other alternatives to $BF_3$. Various arc chamber thermal management arrangements are described, as well as modification of plasma properties, specific flow arrangements, cleaning processes, power management, eqillibrium shifting, optimization of extraction optics, detection of deposits in flow passages, and source life optimization, to achieve efficient operation of the ion implantation system.

21 Claims, 9 Drawing Sheets

(51) Int. Cl.
*H01L 21/265* (2006.01)
*H01J 37/08* (2006.01)
*H01J 37/317* (2006.01)
*C23C 14/48* (2006.01)
*C23C 14/52* (2006.01)

(56) References Cited

U.S. PATENT DOCUMENTS

| | | | |
|---|---|---|---|
| 4,814,842 A | 3/1989 | Nakagawa et al. | |
| 5,443,732 A | 8/1995 | Lahoda et al. | |
| 5,517,077 A | 5/1996 | Bright et al. | |
| 5,977,552 A | 11/1999 | Foad | |
| 6,135,128 A | 10/2000 | Graf et al. | |
| 6,452,338 B1 | 9/2002 | Horsky | |
| 6,734,446 B1 | 5/2004 | Yamazaki et al. | |
| 7,138,768 B2 | 11/2006 | Maciejowski et al. | |
| 7,397,048 B2 | 7/2008 | Singh et al. | |
| 7,518,124 B2 | 4/2009 | Goldberg | |
| 7,641,879 B2 | 1/2010 | Spielvogel et al. | |
| 7,919,402 B2 | 4/2011 | Jacobson et al. | |
| 7,947,582 B2 | 5/2011 | Hautala et al. | |
| 8,013,312 B2 | 9/2011 | Adams | |
| 8,076,694 B2 | 12/2011 | Narukawa et al. | |
| 8,187,971 B2 | 5/2012 | Russell et al. | |
| 8,237,136 B2 | 8/2012 | Hautala et al. | |
| 8,252,651 B2 | 8/2012 | Kawasaki | |
| 8,796,131 B2 * | 8/2014 | Jones et al. | 438/607 |
| 2002/0014407 A1 | 2/2002 | Allen et al. | |
| 2002/0130278 A1 | 9/2002 | Vella | |
| 2003/0023118 A1 | 1/2003 | Kanayama et al. | |
| 2004/0110351 A1 | 6/2004 | Narasimha | |
| 2004/0166612 A1 | 8/2004 | Maydan et al. | |
| 2004/0235280 A1 | 11/2004 | Keys et al. | |
| 2005/0035284 A1 | 2/2005 | Schultz et al. | |
| 2005/0051096 A1 | 3/2005 | Horsky et al. | |
| 2005/0163693 A1 | 7/2005 | Spielvogel et al. | |
| 2005/0169827 A1 | 8/2005 | Spielvogel et al. | |
| 2005/0191816 A1 | 9/2005 | Vanderpool et al. | |
| 2006/0097193 A1 | 5/2006 | Horsky et al. | |
| 2007/0148888 A1 | 6/2007 | Krull et al. | |
| 2008/0138967 A1 | 6/2008 | Li et al. | |
| 2008/0138968 A1 | 6/2008 | Porshnev et al. | |
| 2008/0164427 A1 | 7/2008 | Collart et al. | |
| 2008/0248636 A1 | 10/2008 | Olander et al. | |
| 2008/0305598 A1 | 12/2008 | Horsky et al. | |
| 2009/0087578 A1 | 4/2009 | Hautala | |
| 2011/0079241 A1 | 4/2011 | Sinha et al. | |
| 2011/0165053 A1 | 7/2011 | Cook et al. | |

FOREIGN PATENT DOCUMENTS

| | | |
|---|---|---|
| CN | 101384747 A | 3/2009 |
| EP | 0385709 B1 | 5/1995 |
| JP | 62095820 A | 5/1987 |
| JP | 6438700 A | 2/1989 |
| JP | 3165443 A | 7/1991 |
| JP | 6-204516 A | 7/1994 |
| JP | 7065761 A | 3/1995 |
| JP | 7299304 A | 11/1995 |
| JP | 8288233 A | 11/1996 |
| JP | 11-329266 A | 11/1999 |
| JP | 2006-196465 A | 7/2006 |
| JP | 2008-518482 A | 5/2008 |
| JP | 2009-506580 A | 2/2009 |
| JP | 2011-502923 A | 1/2011 |
| TW | 200832523 A | 8/2008 |
| TW | 200845086 A | 11/2008 |
| WO | 0143157 A1 | 6/2001 |
| WO | 03100806 A1 | 12/2003 |
| WO | 2004003973 A2 | 1/2004 |
| WO | 2005059942 A2 | 6/2005 |
| WO | 2006047373 A2 | 5/2006 |
| WO | 2007027798 A2 | 3/2007 |
| WO | 2007056249 A1 | 5/2007 |
| WO | 2007087212 A1 | 8/2007 |
| WO | 2008121549 A1 | 10/2008 |

OTHER PUBLICATIONS

Hayton, L., et al., "An ESR study of the reaction of silver atoms with $B_2F_4$ under matrix isolation conditions", "J. Chem. Soc., Dalton Trans.", Mar. 8, 2002, pp. 1327-1329.

Wilson, R., et al., "Comparison of Sources of Boron, Phosphorus, and Arsenic Ions", "Appl. Phys. Lett", Feb. 15, 1973, pp. 176-179, vol. 22, No. 4.

* cited by examiner

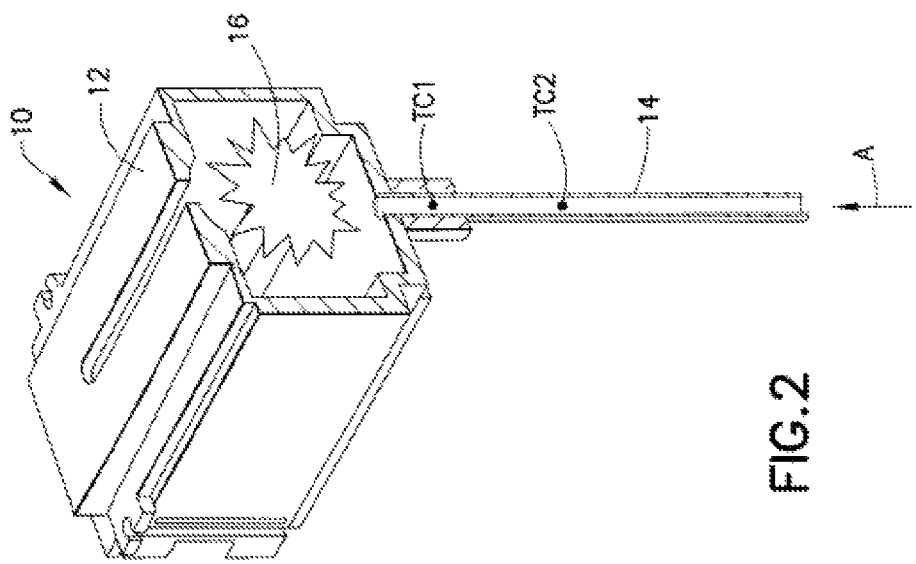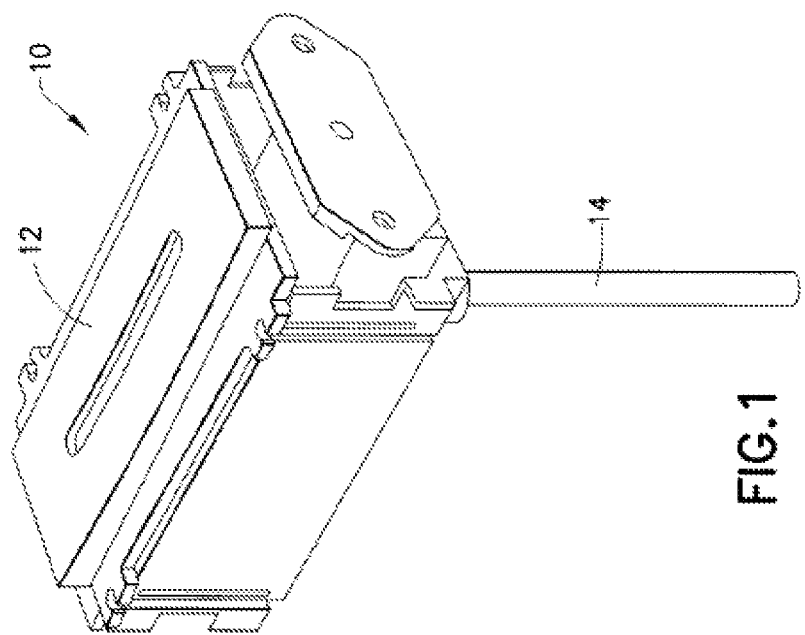

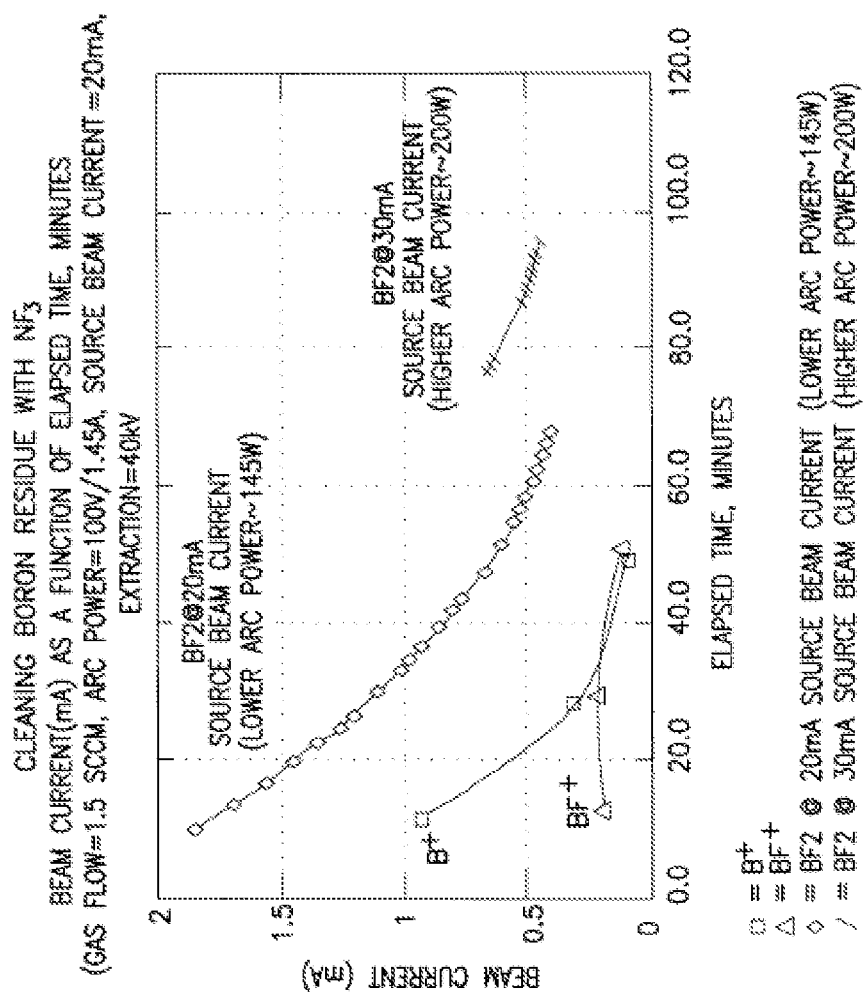

ION IMPLANTATION SYSTEM AND METHOD

CROSS-REFERENCE TO RELATED APPLICATIONS

This is a continuation under 35 USC 120 of U.S. patent application Ser. No. 13/502,855 filed Apr. 19, 2012 in the names of Edward Jones, et al. for "ION IMPLANTATION SYSTEM AND METHOD," and issued Aug. 5, 2014 as U.S. Pat. No. 8,796,131, which in turn is a national phase under 35 U.S.C. §371 of International Patent Application No. PCT/US10/53977 filed Oct. 25, 2010 in the names of Edward Jones, et al. for "ION IMPLANTATION SYSTEM AND METHOD," which in turn claims the benefit of priority of the following U.S. Provisional Patent Applications under 35 USC 119(e): U.S. Provisional Patent Application No. 61/255,097 filed Oct. 27, 2009 in the names of Robert Kaim, et al. for "BORON ION IMPLANTATION APPARATUS AND METHOD;" U.S. Provisional Patent Application No. 61/358,514 filed Jun. 25, 2010 in the names of Edward Jones, et al. for "ACTIVE COOLING FOR ION IMPLANT GAS DELIVERY SYSTEM;" and U.S. Provisional Patent Application No. 61/349,202 filed May 27, 2010 in the names of Edward Jones, et al. for "ACTIVE COOLING FOR ION IMPLANT GAS DELIVERY SYSTEM." The disclosures of all of said U.S. patent application Ser. No. 13/502,855, International Patent Application No. PCT/US10/53977 and U.S. Provisional Patent Application Nos. 61/255,097; 61/358,514; and 61/349,202 are hereby incorporated herein by reference, in their respective entireties, for all purposes.

FIELD

The present disclosure relates to ion implantation systems and processes, and to thermal management of such systems providing unexpected advantages in performance, as well as to ion implantation processes and systems using diboron tetrafluoride ($B_2F_4$), and to boron ion implantation apparatus and methodology generally, e.g., as used in the manufacture of microelectronic devices and semiconductor products such as integrated circuitry.

DESCRIPTION OF THE RELATED ART

Ion implantation is used in integrated circuit fabrication to accurately introduce controlled amounts of dopant impurities into semiconductor wafers and is a crucial process in microelectronic/semiconductor manufacturing.

In such implantation systems, an ion source ionizes a desired dopant element of a dopant source gas. The ion source generates ions by introducing electrons into a vacuum chamber filled with the dopant source gas (also commonly referred to as the "feedstock gas"). Feedstock gases used to generate implant species include, but are not limited to, $BF_3$, $B_{10}H_{14}$, $B_{12}H_{22}$, $PH_3$, $AsH_3$, $PF_5$, $AsF_5$, $H_2Se$, $N_2$, $Ar$, $GeF_4$, $SiF_4$, $O_2$, $H_2$, and $GeH_4$. Collisions of the electrons with dopant atoms and molecules in the gas results in the creation of an ionized plasma consisting of positive and negative dopant ions.

The resulting ions are extracted from the source in the form of an ion beam of desired energy. Extraction is achieved by applying a high voltage across suitably shaped extraction electrodes, which incorporate apertures for passage of the extracted beam. The extracted beam passes through the aperture and out of the ion source as a collimated ion beam, which is accelerated towards the substrate.

The ion beam is impinged on the surface of the substrate, such as a semiconductor wafer, in order to implant the substrate with the dopant element. The ions of the beam penetrate the surface of the substrate to form a region of desired doped character, e.g., specific conductivity. The implanted dopant atoms then can be activated by annealing to form an electrically active doped region. Implanted ion species variously include B, P, As, Se, N, Ar, Ge, Si, O, and H. Boron is a particularly widely used implant species.

There may be many implantation steps in the typical fabrication of a microelectronic device. Increasing wafer sizes, decreasing critical dimensions, and growing circuit complexity place increasingly greater demands on ion implant tools, in respect of better process control, delivery of high beam currents at lower energies, and decrease in the mean time between failures (MTBF) of the implant apparatus.

The economic operation of the ion implantation system requires that downtime of the system is minimized and that the ion source operates efficiently to carry out the generation of ionic species for the implantation operation.

Boron trifluoride ($BF_3$) has traditionally been a standard source for boron doping of microelectronic device structures. However, $BF_3$ is problematic in that it requires a significant amount of energy to break the B—F bond (757 kJ $mole^{-1}$) as compared to other dopant species used in ion implantation, such as arsine (As—H=274 kJ $mole^{-1}$) and phosphine (P—H=297 kJ $mole^{-1}$). As a result, ion sources must operate at high arc voltages when implanting boron. High arc voltages, however, create high energy ions that bombard the hot filament or cathode in the ion source region, contributing to sputter erosion and failure of the cathode.

It has been reported that 80% of the $BF_3$ dopant supplied to an ion implanter may be vented intact, suggesting either that the $BF_3$ is not ionized, or if ionized, that the fragments resulting from initial ionization have recombined. The low ionization of $BF_3$ at high arc voltages therefore is a significant efficiency issue for boron ion implantation.

In addition, the ionization reactions occurring in the ion source region of the implanter apparatus may involve significant deposition of ionization/decomposition species that are generated or otherwise present during the active operation of the ion source in the implant operation.

In consequence, there is a need in the art for alternative boron-containing dopant precursors for use in boron doping of microelectronic device structures, and improved processes and systems, to achieve increased MTBF, process efficiency and operating life of the implanter, with minimal build-up of non-volatile species in the ion source region of the implanter apparatus.

SUMMARY

The present disclosure relates to ion implantation systems and methods.

In one aspect, the disclosure relates to an ion implantation system, comprising:
an ion source including an arc chamber, arranged to ionize gas therein;
a dopant gas source;
a dopant gas feed line for introducing dopant gas from the dopant gas source to the arc chamber; and
a cooling structure associated with the dopant gas feed line, and arranged to cool dopant gas in the dopant gas feed line, to thereby combat heating of the dopant gas by heat generated in operation of the arc chamber, and decomposition of the dopant gas resulting from such heat.

In another aspect, the disclosure relates to a method of implanting ions in a substrate, comprising passing dopant gas from a source of same to an arc chamber of an ion source, under conditions producing ionization of the dopant gas, and cooling the dopant gas prior to entry to the arc chamber, to thereby combat heating of the dopant gas by heat generated in operation of the arc chamber, and decomposition of the dopant gas resulting from such heat.

In yet another aspect, the disclosure relates to a method of operating an ion implantation system utilizing diboron tetrafluoride to generate boron ions for implantation, said method comprising flowing coolant from an ion source coolant supply in heat exchange relationship to said diboron tetrafluoride prior to its entering an ion source chamber of said ion implantation system.

In a further aspect, the disclosure relates to an ion implant apparatus for boron ion implantation, comprising a gaseous boron source supply, and an ion source arranged to receive gaseous boron source from said supply and to ionize said gaseous boron source to form ionic boron species for implantation in a substrate, wherein the gaseous boron source comprises at least one boron compound selected from among $B_2F_4$, $B_2H_6$, $B_5H_9$, $B_3F_5$, $BHF_2$, and $BH_2F$.

Another aspect of the disclosure relates to an ion implantation method, comprising ionizing a gaseous boron source in an ion source to form ionic boron species for implantation in a substrate, wherein the gaseous boron source comprises at least one boron compound selected from among $B_2F_4$, $B_2H_6$, $B_5H_9$, $B_3F_5$, $BHF_2$, and $BH_2F$.

A further aspect of the disclosure relates to a solids deposition monitoring and control system for an ion implantation apparatus including an ion source having associated therewith a flow passage susceptible to deposition of solids deriving from a dopant source material in operation of the ion implantation apparatus, such solids deposition monitoring and control system comprising:

a monitoring device arranged to detect and provide an output indicative of accumulation of deposition solids from the dopant source material in the flow passage; and a control assembly responsive to said output of the monitoring device to modulate operation of the ion implantation apparatus so as to prevent, reduce or reverse the accumulation of deposition solids from the dopant source material in subsequent operation of the ion implantation apparatus.

A still further aspect of the disclosure relates to a method of combating solids deposition an ion implantation system including an ion source having associated therewith a flow path susceptible to deposition of solids deriving from a dopant source material in operation of the ion implantation system, such method comprising monitoring and responsively generating an output indicative of accumulation of deposition solids from the dopant source material in the flow path; and responsively modulating operation of the ion implantation system so as to prevent, reduce or reverse said accumulation of deposition solids from the dopant source material in subsequent operation of the ion implantation system.

Other aspects, features and embodiments of the disclosure will be more fully apparent from the ensuing description and appended claims.

BRIEF DESCRIPTION OF THE DRAWINGS

FIG. 1 is a schematic representation of an ion implantation system, including an arc chamber with a gas feed line for feeding dopant source gas to the arc chamber for ionization thereof in the chamber.

FIG. 2 is a cross section of the FIG. 1 ion implantation system schematically showing the generation of a plasma in the arc chamber of such system.

FIG. 16 is a graph of beam current (mA), as a function of elapsed time (min), for a cleaning operation using NF3 to remove boron residue from surfaces of an ion source chamber.

DETAILED DESCRIPTION

Figure 3:
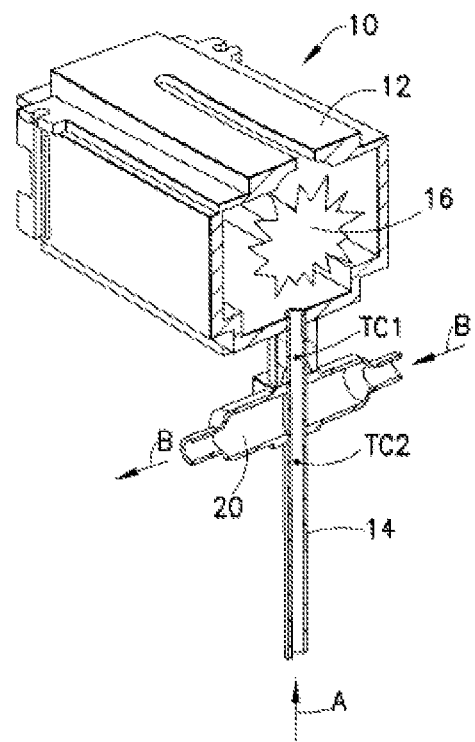
FIG. 3 is a cross section of the FIG. 1 ion implantation system schematically showing the generation of a plasma in the arc chamber of such system, with the gas feed line being modified in relation to the system of FIG. 2 to provide active cooling of such line.

The present disclosure relates to ion implantation systems and methods.

The disclosure is based on the discovery that performance of the ion source and the overall ion implanter operation can be surprisingly enhanced by incorporating cooling of the dopant gas just before the arc chamber of the ion source. The surprising character of this discovery derives from the fact that the ionization process seeks to impart substantial energy to the dopant gas for the formation of ionic species, and it therefore has been conventional practice to allow the heat generated in the ionization operation to propagate through the dopant gas feed line so that the dopant gas is essentially preheated for the ionization and plasma formation operation, as a perceived beneficial arrangement.

Despite this perception, however, it has been found that in the case of certain dopant gases, such as for example diboron tetrafluoride, this heat propagation results in deleterious decomposition of the dopant gas and resulting clogging of the gas feed line. Accordingly, the utilization of cooling of the dopant gas feed line, to effect cooling of the dopant gas flowed through such line, contrary to the approach of the prior art, has been found to provide high performance efficiency in the use of such dopant gases as diboron tetrafluoride, without the incidence of deleterious decomposition of the dopant gas and resulting clogging of the dopant gas feed line to the arc chamber.

Thus, the disclosure contemplates an ion implantation system, comprising:
an ion source including an arc chamber, arranged to ionize gas therein;
a dopant gas source;
a dopant gas feed line for introducing dopant gas from the dopant gas source to the arc chamber; and
a cooling structure associated with the dopant gas feed line, and arranged to cool dopant gas in the dopant gas feed line, to thereby combat heating of the dopant gas by heat generated in operation of the arc chamber, and decomposition of the dopant gas resulting from such heat.

The cooling structure can include a cooling passage arranged to cool the dopant gas feed line and dopant gas flowed therethrough, in the form of a cooling jacket through which may be flowed a suitable coolant, e.g., water or a glycol/water solution, or other suitable heat transfer coolant medium.

For such purpose, the dopant gas feed line may be arranged at a distal end thereof to discharge dopant gas into the arc chamber, with the cooling passage being positioned at a distal end portion of the dopant gas feed line.

The disclosure contemplates in one embodiment an integrated arrangement, in which a water cooling assembly for the ion source is utilized as a source of cooling water, with the water cooling assembly being operatively coupled to the cooling passage associated with the dopant gas feed line, to flow water through the cooling passage to cool the dopant gas feed line and dopant gas flowed therethrough.

The dopant gas source can be of any suitable type, but advantageously, in various specific arrangements, comprises a pressure-regulated gas storage and dispensing vessel, e.g., of a type including an internally disposed regulator to provide dispensing of dopant gas at a pressure set by the set point of the internal regulator assembly, which may include one, two or more regulator devices. Pressure-regulated vessels of such type are commercially available from ATMI, Inc., Danbury, Conn., USA, under the trademark VAC.

The dopant gas source vessel, e.g., the aforementioned pressure-regulated gas storage and dispensing vessel, may contain a dopant gas of any suitable type. In one embodiment, the dopant gas may comprise a boron dopant gas, such as diboron tetrafluoride. When diboron tetrafluoride ($B_2F_4$) is employed as the dopant gas, the cooling structure may be operatively arranged to maintain temperature of diboron tetrafluoride in the dopant feed gas line below 700° C.

The disclosure in another aspect therefore contemplates a method of implanting ions in a substrate, comprising passing dopant gas from a source of same to an arc chamber of an ion source, under conditions producing ionization of the dopant gas, and cooling the dopant gas prior to entry to the arc chamber, to thereby combat heating of the dopant gas by heat generated in operation of the arc chamber, and decomposition of the dopant gas resulting from such heat.

The cooling may include flowing coolant medium through a cooling passage arranged to cool the dopant gas feed line and dopant gas flowed therethrough. As mentioned, the ion source may be arranged with a water cooling assembly, and water from the water cooling assembly can be flowed through the cooling passage to cool the dopant gas feed line and dopant gas flowed therethrough. Dopant gas may be provided from a pressure-regulated gas storage and dispensing vessel containing a boron dopant gas, e.g., diboron tetrafluoride, and the cooling may be effected to maintain temperature of diboron tetrafluoride flowed to the arc chamber below 700° C.

The disclosure in another aspect relates to a method of operating an ion implantation system utilizing diboron tetrafluoride to generate boron ions for implantation, said method comprising flowing coolant from an ion source coolant supply in heat exchange relationship to said diboron tetrafluoride prior to its entering an ion source chamber of said ion implantation system. Such method may also be employed to enhance operating efficiency of an ion implantation system utilizing other dopant source gases that are susceptible to decomposition that may result in clogging the flow passages and undesired downtime of the ion implantation system.

The cooling approach of the present disclosure thus affords a way to prevent decomposition of diboron tetrafluoride, or other decomposition-susceptible gas, when used for ion implantation, while using the existing cooling capability (deionized water) of the ion source to actively cool the dopant gas feed line and surrounding region of the arc chamber. Cooling the dopant gas feed line thereby reduces the heating of the dopant gas prior to its entering the arc chamber.

FIG. 1 is a schematic representation of an ion implantation system 10, including an arc chamber 12 with a gas feed line 14 for feeding dopant source gas to the arc chamber for ionization thereof in the chamber.

FIG. 2 is a cross section of the FIG. 1 ion implantation system 10 schematically showing the generation of a plasma 16 in the arc chamber 12 of such system. The dopant gas is flowed in the direction indicated by arrow A into the dopant gas feed line 14, having monitoring thermocouples TC1 and TC2 secured thereto in monitoring relationship to determine the quality of the thermal state of the feed line and gas entering the arc chamber.

FIG. 3 is a cross section of the FIG. 1 ion implantation system 10 schematically showing the generation of a plasma 16 in the arc chamber 12 of such system, with the gas feed line 14 being modified in relation to the system of FIG. 2 to provide active cooling of such line. Specifically, the gas feed line 14 has associated therewith a coolant passage 20 through which cooling medium flows in the direction indicated by arrows B. The monitoring thermocouples TC1 and TC2 are secured in monitoring relationship to the dopant gas feed line to determine the quality of the thermal state of the feed line and gas entering the arc chamber.

The coolant passage may be configured as a cooling jacket on the dopant gas feed line, or may include passages circumscribing or interdigitated with the gas feed line, or include other heat exchange or coolant elements, arrays or assemblies effective to provide cooling to the dopant gas so that decomposition and deposition of clogging solid by-products in the gas feed line and in the arc chamber are avoided.

It will therefore be appreciated that the cooling arrangement of the present disclosure can be implemented and operated in any suitable manner to effect the requisite cooling of the dopant gas, and the cooling arrangement may further be integrated with a thermal management control system for the ion source, so that the flow rate of the coolant and other operating parameters are appropriately set for effective ion implantation with dopant source gases such as $B_2F_4$ that would otherwise be unsuitable for ion implantation usage. The cooling arrangement of the present disclosure can be utilized with ion implantation systems of widely varied type, utilizing correspondingly varied dopant source gases, including, for example, arsine, phosphine, etc.

In one specific embodiment, the arc chamber was coupled with a dopant gas feed line having a 0.18 inch inner diameter, and a length of 4-6 feet from a VAC® source vessel containing $B_2F_4$ with the dopant gas being flowed to the arc chamber at a flow rate of 2-3 standard cubic centimeters per minute (sccm). The arrangement shown in FIG. 3 was employed, in which TC1 was approximately 0.4 inch from the arc chamber, in the dopant gas feed line, and TC2 was approximately 1.4 inch from the arc chamber in such gas feed line. The resulting data were generated, for the situation without any cooling being implemented, and with water cooling being employed. The data are shown in Table 1 below

TABLE 1

| Temperature Measurements | Without Cooling | With Cooling | Percent Change |
|---|---|---|---|
| TC1 (° C.) | 698 | 224 | −68% |
| TC2 (° C.) | 441 | 66 | −85% | and demonstrate the efficacy of the FIG. 3 arrangement for delivery of $B_2F_4$ without decomposition, at temperature significantly below 700° C.

FIGS. 4-8 show various additional implementations of the present disclosure, involving heat sink apparatus secured to an ion source apparatus to effect cooling of dopant source gas fed to the ion source apparatus.

Figure 4:
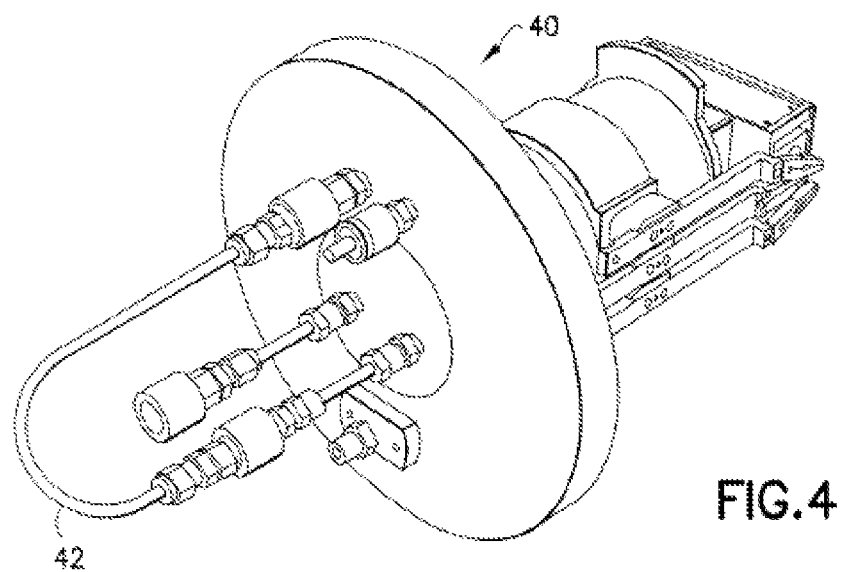
FIG. 4 is a perspective view of an ion source apparatus in which a jumper line has been provided to flow ion source cooling water from the cooling water outlet of the ion source to the inlet of the heat sink provided for cooling of the dopant source gas (heat sink not shown in this view).

FIG. 4 is a perspective view of an ion source apparatus 40 in which a jumper line 42 has been provided to flow ion source cooling water from the cooling water outlet of the ion source to the inlet of the heat sink provided for cooling of the dopant source gas (heat sink not shown in this view). This arrangement therefore utilizes existing cooling water supply from the ion source apparatus that is utilized for cooling of the arc chamber and other components of the ion source apparatus, and thereby provides an additional cooling capability in the ion implantation system that is dedicated to cooling the dopant source gas.

Figure 5:
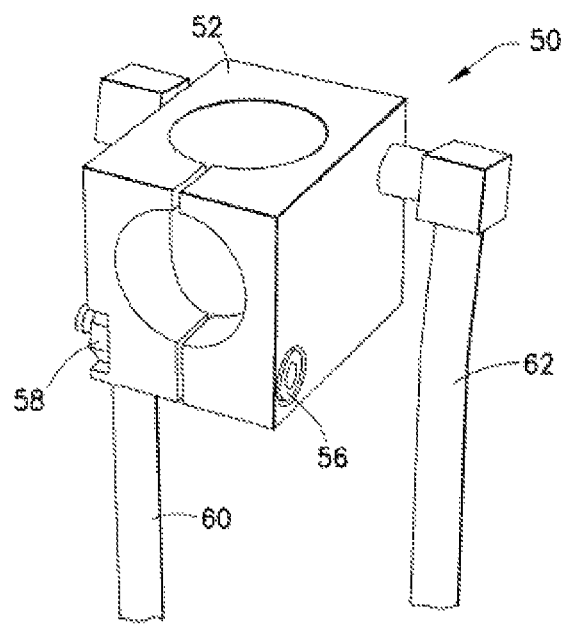
FIG. 5 is a perspective view of a heat sink apparatus that is mechanically secured to the dopant source gas feed passages, with cooling water being flowed through the heat sink body to cool the dopant source gas.

FIG. 5 is a perspective view of a heat sink apparatus 50 that is mechanically secured to the dopant source gas feed passages, as hereinafter more fully shown, with cooling water being flowed through the heat sink body 52 by coolant flow lines 60 and 62, to cool the dopant source gas. Thus, the heat sink body includes one or more internal passages through which coolant is flowed through the heat sink body, to effect cooling of the heat sink body and the dopant source gas being flowed in other passages through the heat sink body, as hereinafter described. The heat sink body is provided with a socket head cap screw 56 and a text nut 58, as cooperative fastener elements that permit the mechanical securement of the heat sink body to dopant source gas feed passage structure as described hereafter in connection with FIG. 8. The coolant flow lines 60 and 62 can be coupled with the ion source cooling water flow circuitry, as will be appreciated from the preceding discussion in respect of FIG. 4.

Figure 6:
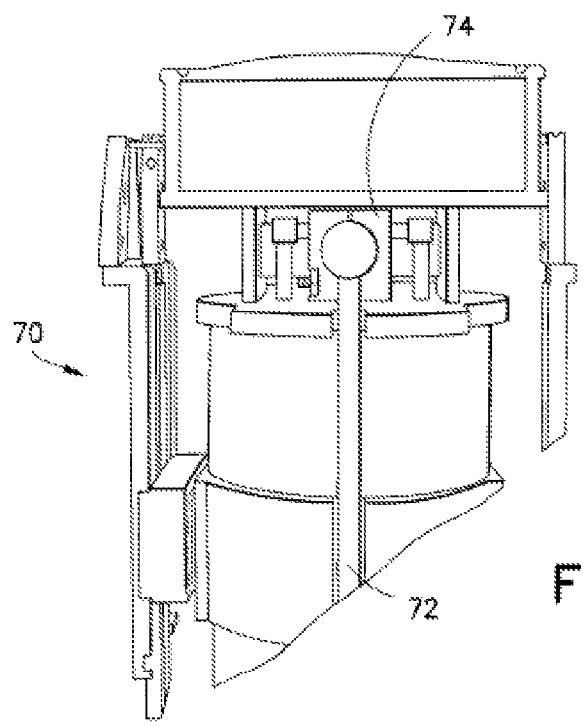
FIG. 6 is a perspective view of an ion source apparatus having a heat sink apparatus mechanically secured to the dopant source gas feed passages for cooling of the dopant source gas flowed to the ion source apparatus.

FIG. 6 is a perspective view of an ion source apparatus 70 having a heat sink apparatus 74 mechanically secured to the dopant source gas feed passages for cooling of the dopant source gas flowed in gas feed line 72 to the ion source apparatus.

Figure 7:
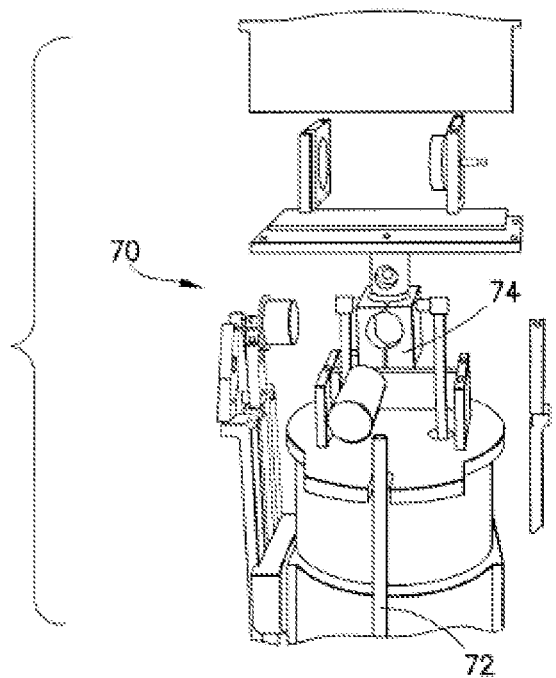
FIG. 7 is an exploded perspective view of the ion source apparatus of FIG. 6, on which the heat sink apparatus has been installed, showing details thereof.

FIG. 7 is an exploded perspective view of the ion source apparatus 70 of FIG. 6, on which the heat sink apparatus 74 has been installed for cooling of dopant source gas flowed to the ion source apparatus in line 72, showing details of the ion source assembly including the ion source apparatus and the heat sink apparatus.

Figure 8:
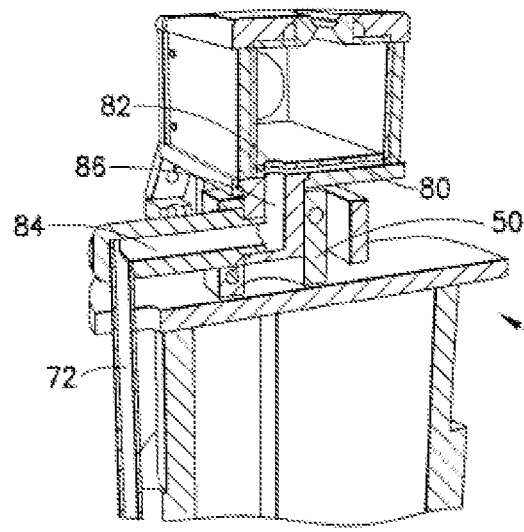
FIG. 8 is a perspective view, in cross-section, of the ion source assembly comprising the ion source apparatus and heat sink apparatus variously shown in FIGS. 5-7.

FIG. 8 is a perspective view, in cross-section, of the ion source assembly comprising the ion source apparatus 70 and heat sink apparatus 50. This cross-sectional view shows the dopant source gas feed line 72 connecting to gas flow passage 84 in the gas feed plug and to the gas flow passage 86 in the gas bushing associated with the ion source. Gas flow passages 84 and 86 may be on the order of 0.25-0.375 inch in one embodiment of the disclosure, such passage internal diameter being larger than conventional used in the illustrated apparatus. Such oversized gas flow passages are usefully employed when the dopant source gas is susceptible to decomposition that may in turn results in clogging of the gas flow passage. Such decomposition-susceptible dopant source gases include diboron tetrafluoride. As a result, the oversized gas flow passage arrangement shown in FIG. 8 enables extended life between maintenance events for the ion source apparatus.

The ion source apparatus shown in FIG. 8 includes a base liner 80 which is modified to include an opening 82 therein, and this modification has been found to provide improved ion source operating life when decomposition-susceptible dopant source gases are utilized.

The ion source apparatus having a heat sink apparatus installed thereon, with the oversized dopant source gas feed passages, and the provision of a gas flow opening in the base liner of the ion source, together provide a high efficiency ion source configuration with extended operating life for dopant source gases such as diboron tetrafluoride, in relation to corresponding ion source apparatus backing the heat sink apparatus, base liner opening and oversized dopant source gas feed passages.

It will be appreciated that the heat sink apparatus may take various other forms, and instead of being mechanically secured to dopant source gas flow lines, the heat sink apparatus may be welded, soldered, brazed to the dopant source gas flow lines, or the heat sink apparatus may take the form of cooling water tracing of the gas flow line, or other exchange or heat transfer cooling structures and methods may be employed, to reduce temperature of the dopant source gas, so that it is not prematurely decomposed before being subjected to ionization conditions.

Figure 9:
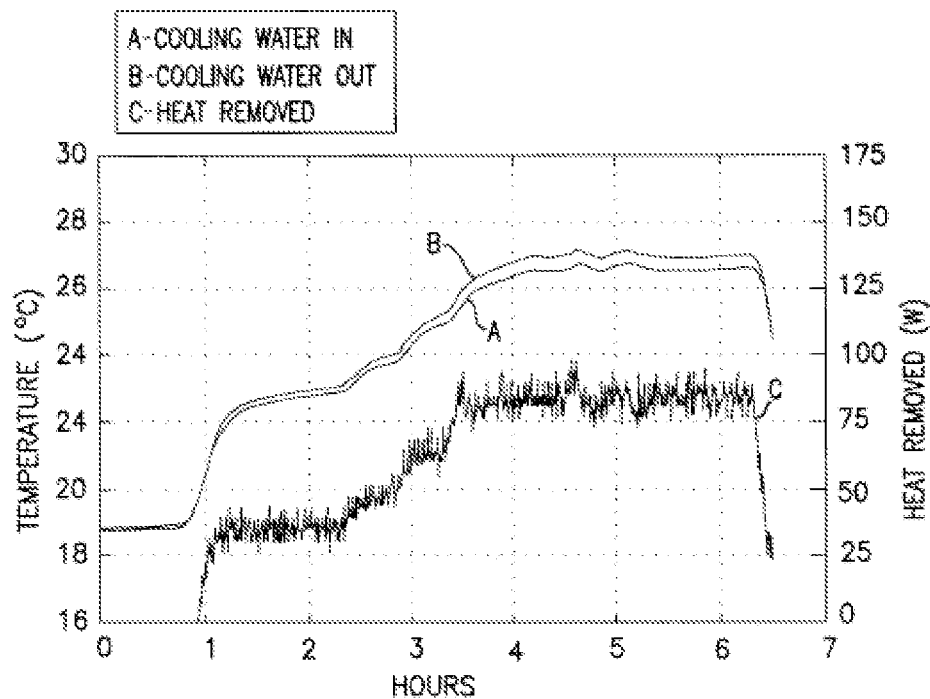
FIG. 9 is a graph of temperature, in degrees Centigrade, and heat removed, in Watts, as a function of time, showing operational data for an ion source assembly comprising the ion source apparatus and heat sink apparatus variously shown in FIGS. 5-8.

FIG. 9 is a graph of temperature, in degrees Centigrade, and heat removed, in Watts, as a function of time, showing operational data for an ion source assembly comprising the ion source apparatus and heat sink apparatus variously shown in FIGS. 5-8. The data shown in FIG. 9 were generated with $B_2F_4$ as the dopant source gas, flowed at a rate of 1.6 standard cubic centimeters per minute through 0.25 inch feed passages to the ion source apparatus, with cooling water being flowed through the heat sink body of the heat sink apparatus had a flow rate of 3 L per minute. The data show that significant sensible heat is removed from the dopant source gas stream, so that it is effectively cooled for improved ion source system operation.

Concerning now the ion implantation of boron in greater detail, as regards dopant source materials, apparatus and methodology, $BF_3$ is the most commonly used precursor for boron implantation. $BF_3$, unlike precursors employed for implantation of other elements such as phosphorus, arsenic and silicon, is not highly efficient in producing B+ ions under plasma conditions, in consequence of the strong B—F bond.

Figures 10, 11:
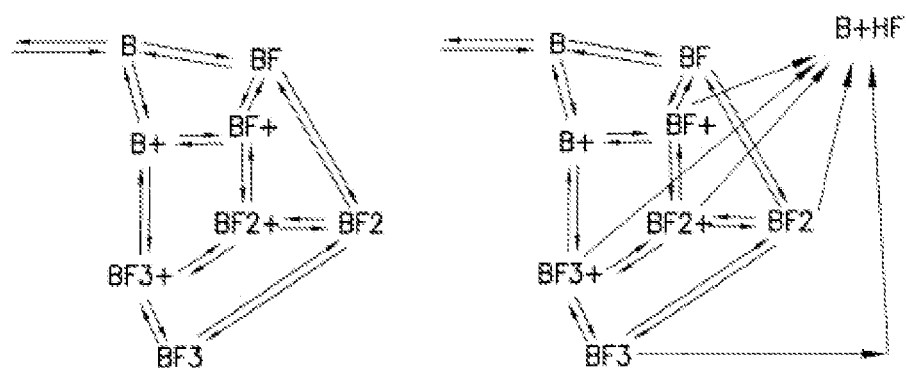
FIG. 10 is a schematic illustration of a simplified reaction matrix for boron implantation utilizing $BF_3$ plasma.
FIG. 11 is a schematic representation of a simplified reaction matrix of $BF_3$ plasma utilizing hydrogen additives.

FIG. 10 shows a simplified reaction matrix of $BF_3$ plasma, illustrating the species and reactions involved in the plasma arc chamber of an ion implanter when $BF_3$ is used as a dopant source material. It is apparent that $BF_3$ stability will affect the concentration of different ions and neutral molecules because the reaction starts with the ionization of the precursor $BF_3$. Nonetheless, at elevated temperature and under ionization conditions involving bombardment of electrons, the distribution of different species is ultimately determined by the stability of all the species involved and the equilibrium between them under conditions of chemical reaction and dissociation and/or electron ionization and recombination. Thus, similar distributions of ions may exist with different precursors.

In the foregoing reaction matrix, one or more additives can be employed to shift the reaction equilibrium toward B+. For example, when $BF_3$ is used as a dopant source, a small amount of hydrogen and/or methane can be co-flowed with $BF_3$ to the implanter. Hydrogen, methane, or a hydrogen/methane mixture introduced with such boron trifluoride dopant source will produce hydrogen in the plasma, and such hydrogen will capture the fluorine atoms to form HF, which is extremely stable. Accordingly, the system will shift to a plasma containing mostly HF, B and corresponding ions. Such a reaction system is shown in FIG. 11, wherein the reactions in the matrix of the $BF_3$ plasma are shown with hydrogen additives.

The present disclosure relates to various apparatus arrangements and processing methods for ion implantation of boron. It will be recognized that although various embodiments and aspects are variously disclosed in specific implementations, one or more of the multiple features of various different embodiments or aspects may be combined with one another, to constitute a modified or composite apparatus or process methodology, in further applications of the present disclosure.

While various aspects of the disclosure are directed to specific utilization of $B_2F_4$ as a boron precursor material for ion implantation of boron, other boron source materials may be employed in the broad practice of the present disclosure, including boron sources such as $B_2H_6$, $B_5H_9$, $B_3F_5$, $BHF_2$ and $BH_2F$.

In one aspect, the present disclosure relates to arc chamber temperature modification. Under certain conditions, $B_2F_4$ can thermally decompose in the gas line leading up to the arc chamber and within the arc chamber where the gas is dispersed. This thermal decomposition entails adverse effects. For example, deposition of boron solids may result, which can cause poor ion source life and/or poor beam current performance of B+, $BF_2$+, etc. Decomposition and resultant deposition of solids can restrict or block the flow of gas completely. The location of the deposition can be within the source tube, prior to the arc chamber, at the exit of the source tube where the gas feeds into the arc chamber and/or in the gap between the source tube outlet and the arc chamber liner in arc chambers that have liners.

The disclosure contemplates the resolution of such deficiencies, by reducing temperature of the region where the source tube connects to the arc chamber. Such region includes the last several inches, e.g., 5-10 cm, of the source tube, the actual location where the source tube mates to the arc chamber and/or within the arc chamber near the location where the source tube mates. Reducing temperature in such circumstances reduces the rate of thermal decomposition of $B_2F_4$, which in turn results in reduced boron deposition.

For this purpose, reduction of temperature can be effected in a variety of ways.

One method of temperature reduction involves power management of the arc chamber so that it operates at lower arc voltage and current.

Temperature reduction can be achieved by increased efficiency of the arc chamber. This can be accomplished by modifying components such as the cathode, to achieve a more efficient electron emission. It may be desirable to utilize smaller cathodes for such purpose. A more efficient arc chamber requires less energy and therefore, all other factors being constant, lower overall arc chamber body temperature can be achieved. This in turn reduces the temperature of the source tube, the source tube-arc chamber interface, and the arc chamber temperature near the interface.

As a further approach to reducing temperature, more efficient heat transfer from the arc chamber can be effected. Since most heat is dissipated by radiation heat transfer, a variety of approaches can be implemented to increase the rate of heat dissipation. For example, the surface of the arc chamber can be increased, e.g., by making a larger arc chamber, a thicker-walled arc chamber (while not changing the internal dimensions), or by adding heat dissipation surfaces, such as fins, rods, etc.

Enhanced heat transfer efficiency from the arc chamber can also be achieved by increasing the outside wall temperature of the arc chamber, for a given arc chamber power level. Such increase of the outside wall temperature can be effected by maximizing the arc chamber conductivity, through use of high conductivity materials of construction, and minimization of any thermal contact resistances in the structure. For example, a single piece tungsten or molybdenum arc chamber can be employed.

Thus, the disclosure contemplates arc chamber thermal modifications, which may include thermal/temperature management to prevent or minimize deposition and clogging in feed tubes or lines or other components of the arc chamber. Alternatively, coating materials may be applied to inhibit decomposition, or the feed tube may be shielded to accomplish the same objective. The irradiation load may be minimized, and irradiative drain on the nozzle can be effected, to minimize conductive drain associated with the nozzle.

As a still further arc chamber temperature modification, the residence time in the arc chamber can be decreased in areas of high temperature, as for example by using higher flows through such areas.

More efficient heat transfer from the arc chamber can also be achieved by coating, wrapping or covering the outside surface of the arc chamber with a material of higher emissivity than the existing materials of construction.

The arc chamber can also be enhanced in thermal character by constructing the arc chamber from more than one material, wherein a second or more than two additional materials of construction having a different emissivity than the first material are utilized. The amount of the second or additional material(s) is selected to reduce temperature of the arc chamber by a sufficient amount that significantly reduces or eliminates thermal decomposition of the dopant gas in the source tube or at the inlet of the arc chamber.

For example, two of the walls of the arc chamber may be fabricated of graphite, having an emissivity of 0.7-0.8, and the other four walls of the arc chamber may be fabricated of tungsten, having an emissivity of approximately 0.1-0.2 at typical arc chamber temperatures. In one embodiment, the wall to which the dopant gas feed tube is connected, is fabricated of graphite since the higher emissivity of such material will drive temperature of the arc chamber lower than would otherwise be the case if lower emissivity material were used as the material of construction of such wall. In another embodiment, two or more walls of the arc chamber are formed of graphite or other high emissivity material. In a specific embodiment, all of the walls (top, bottom, sides, front and back) are fabricated of graphite or other high emissivity material.

The arc chamber may be modified in other ways to increase emissivity, such as by reaction, thermal cycling, etc. The heat transfer efficiency to remove heat from the arc chamber can also be achieved by reducing the temperature of the surface being radiated to, e.g., the source housing or components of the source housing. Temperatures of these components can be decreased by active or passive cooling, e.g., using a coolant fluid such as air, water, etc.

In addition to, or in lieu of, optimization of radiation cooling, the arc chamber can be cooled by forced convection. For such purpose, a cooling agent such as water, air, etc. can be flowed around or through (via grooves, for example) the arc chamber. The coolant in such arrangement thereby serves to minimize the arc chamber temperature.

As a further approach, the heat transfer from the arc chamber can be increased by reducing the contact resistance between the arc chamber and the source housing, by increasing the contact area and/or improving the surface finish, and/or by increasing the conductivity of the supports.

Better temperature control of the source tube, source tube interface and immediate area within the arc chamber near the source tube can be of significant benefit. For example, a thermally non-conductive adaptor can be used at the source tube to arc chamber interface. Such an adaptor will aid in minimizing the temperature of the source tube and increasing the temperature gradient in that region.

Using a coaxial adaptor at the source tube to arc chamber interface can also be employed to achieve better temperature control. Such a coaxial adaptor would further minimize the temperature of the feed gas until it enters the arc chamber, since the inside tube will not be in thermal contact with the arc chamber, and the outside tube should assist in shielding the inside tube from radiation.

The section of the arc chamber near the gas source tube to the arc chamber interface may be modified so that it is of a different, and thermally less conductive, and/or higher emissivity, material. Such expedients will assist in reducing temperature in the interface.

The section of the arc chamber near the gas source tube to the arc chamber interface may be modified to include a radiation shield. The shield will reduce radiative heat transfer to the source tube at the arc chamber interface.

As a further modification, the gas tube may be constructed from a material having low thermal conductivity, so that heat transfer along the length of the tube is minimized. Alternatively, the gas tube may be constructed from a material having a high thermal conductivity so that heat transfer is maximized from the hot end of the tube (near the arc chamber) to the cold end of the tube (remote from the arc chamber).

Another approach for thermal modification to achieve more efficient heat transfer from the arc chamber involves modifying the arc chamber to contain small cylindrical protrusions of suitable size, e.g., having a diameter greater than or equal to ⅜ inch (0.9525 cm). The source tube adaptor in one embodiment is connected to such a protrusion. This arrangement enables the source tube/arc chamber interface temperature to be reduced, due to the length of the protrusion, and enables a molecular flow regime to be developed in the protrusion itself. The protrusion thereby becomes a cold/hot interface, and deposition in such region will be reduced due to the reduced number of wall collisions occurring as a result of the molecular flow.

A further thermal modification involves decrease of the residence time, $\tau(=V/Q)$, wherein V=volume of the source tube and Q=volumetric flow rate of the boron source gas), of the boron source gas, e.g., $B_2F_4$, within the source tube. Such decrease in the residence time can be achieved in conjunction with methods to reduce temperature, or as a stand alone modification. Reducing residence time reduces the extent of thermal decomposition that can occur within the source tube or within the source tube-arc chamber interface region.

Residence time can be decreased in a variety of ways, e.g., by adding a diluent gas to increase the overall flow rate. As long as flow rate is increased by a larger percentage than the resulting pressure increase, and the residence time will decrease. The diluent gas can be of any suitable type, and may for example comprise a noble gas, an inert gas, $BF_3$, $H_2$, $CH_4$, $NH_3$, etc.

The residence time can also be reduced by using a smaller diameter shielded (coaxial) tube to increase the velocity in the cooler region approaching the arc chamber before transitioning to an insulating adaptor, or by increasing the diameter of the tube.

Any modification to the geometry, vacuum conductance, or pumping capabilities that enables a velocity increase in accordance with the Continuity of Mass equation, $\rho 1^*v1^*A1=\rho 2^*v2^*A2$, wherein A2 (the cross-sectional area of location 2) and $\rho 2$ (density at location 2) to be changed in order to ensure that v2>v1, will reduce the residence time of the gas flow to the arc chamber.

In a further modification, the deposition of unwanted decomposition species can be managed by using a large diameter tube/adaptor of suitable dimensions, such as a diameter greater than 0.25 inch (0.635 cm). Deposition may occur for some period of time, but will take longer to form a complete blockage of the passageway, and/or may not become blocked at all since the boron residue will act as a self-insulating material and will eventually stop building up, once temperature has been sufficiently reduced. Such deposition management may involve the provision of multiple inlets for the gas to be flowed into the arc chamber, or through the liner so that if one port becomes blocked, then the gas can continue to flow.

In another implementation, the disclosure contemplates arc chamber modifications that may include one or more of: utilization of a different material of construction than normally is employed for arc chamber fabrication; optimization of arc voltage for $B_2F_4$ or other specific boron source material; electron behavior optimization; optimization of beam transmission for $B_2F_4$ or other boron source material; and optimization of the fractionation of B2F4 or other specific boron source material. In such manner, the arc chamber may be constructed and arranged to achieve significant operating advantages.

Another aspect of the disclosure relates to modification of plasma properties, by use of magnets, or by adjustment or optimization of boron source operating parameters. In this respect, optimization of arc voltage for $B_2F_4$ or other specific boron source material can be employed as an enhancement technique. Electron energy distribution in the plasma can be lowered by lowering arc voltage. Lower arc voltage can be used with $B_2F_4$, as compared to $BF_3$, due to lower binding energy associated with $B_2F_4$. Lower arc voltage has other benefits, in that lower cathode sputtering accompanying such lower arc voltage levels can improve ion source life.

Arc power (arc voltage×arc current) can be optimized for the boron source gas, e.g., $B_2F_4$. Concerning the choice of specific boron source material, $B_2F_4$ can enable lower power operation to be achieved, as compared to $BF_3$; this in turn has advantages for source life and source stability, since there is less plasma instability, and less high voltage arcing.

Concerning the ion source operating parameters, source tuning and optimization techniques can be employed to modify plasma properties for high performance operation of the implanter.

In another embodiment, co-bleed or co-flow of diluents, reactants and/or cleaning agents may be employed to achieve operational advantages in the ion implant system. For example, a diluent, reactant and/or cleaning agent may be employed to react with boron, or to mitigate boron deposition. This may involve boron deposition, or removal/cleaning of dopant materials that are deposited in the arc chamber prior to flowing the boron source material to the ion source during active processing, or it may involve etching and depositing metal or other material in the arc chamber, gas line, or other parts of the ion source.

Reactants or cleaning agents may be employed, for example, to address $B_2F_4$ decomposition and accumulation of deposits in the gas line that result from the use of such source material.

A boron-containing diluent, reactant and/or cleaning agent may be employed, such as $B_2H_6$, $B_5H_9$, $BF_3$, etc. A dilute feed gas with inert or other suitable diluent material may be employed, such as $XeF_2$, Ar, $N_2$, a mixture of Xe and $H_2$, $CH_4$, $NH_3$, etc. Alternatively, a system/hardware implementation may be employed in which mixtures are delivered from a single package, pre-mixed before delivery to the arc chamber, or materials may be individually delivered to the arc chamber via separate delivery lines.

Another aspect of the disclosure relates to cleaning processes, which may involve sequential or concurrent flow of $B_2F_4$ and cleaning agent, to perform cleaning and implantation of $B_2F_4$, or molecular ions or atomic ions thereof, concurrently or sequentially.

For example, concurrent flow of $B_2F_4$ or other molecules such as $B_2H_6$, $B_5H_9$, $B_3F_5$, $BHF_2$, or $BH_2F$, and one or more cleaning agents, can be employed during ion implantation.

Alternatively, $B_2F_4$ or such other molecules, and an agent capable of shifting the equilibrium between solid boron and boron in the gas phase toward boron in the gas phase, can be co-flowed through the apparatus. Fluorine-containing gases that do no react with $B_2F_4$ can serve as such agents. The disclosure thus contemplates utilization of equilibrium shifting toward the desired ionic species, e.g., B+, in the gas phase.

Sequential cleaning of an ion source, between ion implantation steps using $B_2F_4$ or the aforementioned molecules or combinations thereof, can be employed to flow a cleaning agent gas continuously or pulse-wise through the apparatus.

The disclosure in another aspect relates to use of specific feed materials, molecules and molecule combinations, and methods for implanting the same, using one or more of source materials such as $B_2F_4$, $B_2H_6$, $B_5H_9$, $B_3F_5$, $BHF_2$, and $BH_2F$. Such materials may be employed for implantation of atomic ions such as B+ or F+. Such materials may be employed for implantation of molecular ions formed by fragmentation of the feed molecules or fragment recombination, such as $BF^+$, $BF^{2+}$, $B_2F_4^+$, $B_2F^{3+}$, $B_2F^{2+}$, etc.

The foregoing boron source materials can be used for atomic or molecular ion implantation in conventional beam line or plasma (e.g., PLAD or PIII) ion implantation tools, e.g., in ion or plasma ion implantation processes, such as conventional ion implantation, plasma immersion or pulse-plasma doping ion implantation, etc.

The foregoing boron source materials can also be used for boron implantation using gas cluster ion beam (GCIB) technologies. Generation of a GCIB involves agglomeration of a source material into neutral clusters, ionization of the clusters, and subsequent acceleration and mass selection on the way to a target. Agglomeration may be facilitated by use of non-dopants such as $N_2$, Ar, etc.

As indicated, an advantage of $B_2F_4$ as a boron source material is that it allows the implanter to operate at lower power than when $BF_3$ is used as a source material.

In a further aspect, the disclosure contemplates optimization of extraction optics for higher B+ fractions, or optimization of extraction or beam optics for $B_2F_4$. When extracting maximum B+ from $BF_3$ plasma, the space charge in the extraction region is very high because of high beam current and high mass of fragments involved. Concerning high beam current, the extracted current is the sum of all ions, including F+, BF+, $BF_2$+, etc., which can be greater than three times the B+ current. Space charge is proportional to beam current, and with higher B+ fractions, the total current in the extraction region can be reduced. Concerning the high mass of fragments involved, the average mass is greater than 11. Space charge is proportional to $(mass)^{1/2}$. With a higher B+ fraction, average mass is reduced.

Accordingly, space charge in the extraction gap can be reduced with $B_2F_4$. Reduced space charge allows different optimization of the extraction optics immediately downstream of the ion source to be achieved. A larger extraction gap (lower electric field) is allowable. This is advantageous to reduce high voltage arcing. Appropriate design of extraction apertures can also be utilized to enhance beam quality and stability.

Source life optimization can be employed in various applications of the disclosure, to prevent or minimize detrimental occurrences. For example, potential arc chamber or ion source failure modes can be overcome or avoided by such source life optimization. Appropriate ratios of materials and/or operating conditions (e.g., plasma properties) can be selected to manage halogen recycling efforts, and operating conditions and ratios of materials can also utilize co-bleed arrangements.

The various aspects and embodiments of the disclosure can be implemented in and practiced with a variety of ion implant systems.

Figure 12:
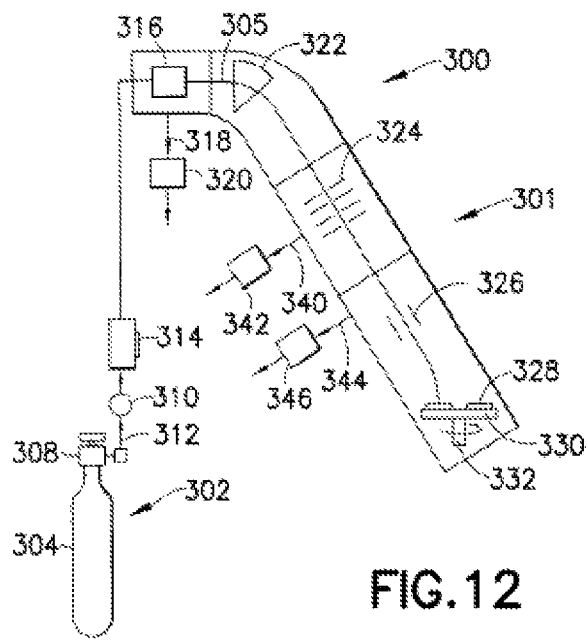
FIG. 12 is a schematic representation of an ion implant process system including a storage and dispensing vessel containing gas which is supplied for ion implantation doping of a substrate in the illustrated ion implant chamber.

FIG. 12 is a schematic representation of an ion implant process system 300 including a storage and dispensing vessel 302 holding $B_2F_4$ gas which is supplied for ion implantation doping of a substrate 328 in the illustrated ion implant chamber 301.

The storage and dispensing vessel 302 comprises a vessel wall 306 enclosing an interior volume holding the $B_2F_4$ gas.

The vessel may be a gas cylinder of conventional type, with an interior volume arranged to hold only gas, or alternatively, the vessel may contain a sorbent material having sorptive affinity for the dopant source gas, and from which the dopant source gas is desorbable for discharge from the vessel under dispensing conditions.

The storage and dispensing vessel 302 includes a valve head 308 coupled in gas flow communication with a discharge line 312. A pressure sensor 310 is disposed in the line 312, together with a mass flow controller 314. Other monitoring and sensing components may be coupled with the line, and interfaced with control means such as actuators, feedback and computer control systems, cycle timers, etc.

The ion implant chamber 301 contains an ion beam generator or ionizer 316 receiving the dispensed $B_2F_4$ gas from line 312 and generating an ion beam 305. The ion beam 305 passes through the mass analyzer unit 322 which selects the ions needed and rejects the non-selected ions.

The selected ions pass through the acceleration electrode array 324 and then the deflection electrodes 326. The resultingly focused ion beam is impinged on the substrate element 328 disposed on the rotatable holder 330 mounted in turn on spindle 332. The ion beam of B+ ions is used to p-dope the substrate as desired to form a p-doped structure.

The respective sections of the ion implant chamber 301 are exhausted through lines 318, 340 and 344 by means of pumps 320, 342 and 346, respectively.

Figure 13:
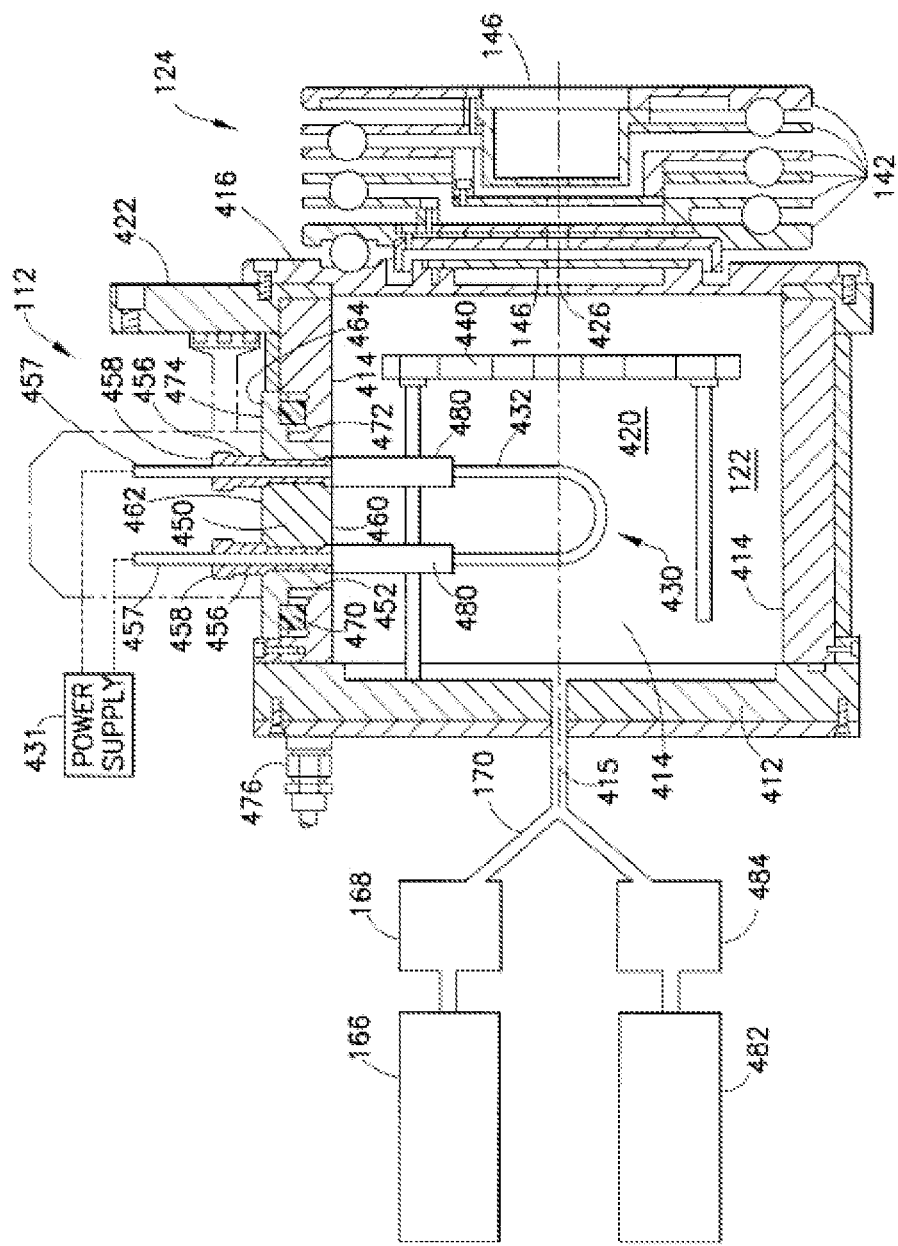
FIG. 13 is a cross-sectional view of an ion source of an ion implantation system.

FIG. 13 is a cross-sectional view of an ion source such as may be usefully employed in an ion implantation system of the type shown in FIG. 12, and which is more fully described in U.S. Pat. No. 6,135,128 issued Oct. 24, 2000 to M. A. Graf, et al.

The ion source 112 comprises a housing which defines a plasma chamber 122, and an ion extractor assembly. Energy is imparted to the ionizable dopant gas to generate ions within the plasma chamber 122. Generally, positive ions are generated, although the present disclosure is applicable to systems wherein negative ions are generated by the source. The positive ions are extracted through a slit in the plasma chamber 122 by the ion extractor assembly 124, which comprises a plurality of electrodes 142. Accordingly, the ion extractor assembly functions to extract a beam of positive ions from the plasma chamber through an extraction aperture plate 146 and to accelerate the extracted ions toward a mass analysis magnet (not shown in FIG. 13).

Ionizable dopant gas is flowed from a source 166 of ionizable dopant gas and is injected into the plasma chamber 122 through conduit 170 containing mass flow controller 168 therein. The source 166 may include a sorbent-based gas storage and supply vessel, e.g., of a type as commercially available from ATMI, Inc. (Danbury, Conn., USA) under the trademark SDS, a pressure-regulated vessel including an internal gas pressure regulator, e.g., of a type commercially available from ATMI, Inc. (Danbury, Conn., USA) under the trademark VAC, or, when a solid dopant source material is employed, the source 166 may include a solid source vessel, e.g., of a type as commercially available from ATMI, Inc. (Danbury, Conn., USA) under the trademark ProE-Vap. The plasma chamber 122 has electrically conductive chamber walls 412, 414, 416 that bound an ionization zone 420 in the chamber interior. Side wall 414 is circularly symmetric about a center axis 415 of the plasma chamber 122. A conductive wall 416 that faces a resolving magnet is connected to a plasma chamber support 422. Wall 416 supports the aperture plate 146 having multiple openings that allow ions to exit the plasma chamber 122 and then combine to form the ion beam at a location downstream from multiple spaced apart and electrically isolated extraction electrodes 124. The aperture plate 146 includes a number of openings arranged in a specified pattern that align with similarly configured multiple apertures in the spaced-apart extraction electrodes 142. Only one such aperture is shown in FIG. 13.

A metallic antenna 430 has a metal surface 432 exposed within the chamber interior for emitting energy into the plasma chamber 122. A power supply 434 outside the plasma chamber 122 energizes the metallic antenna 430 with a radio frequency (RF) signal of suitable character, e.g., an RF signal of approximately 13.56 megahertz (MHz), to set up an alternating electric current in the metallic antenna to induce an ionizing electric field within the plasma chamber 122. The power of the antenna may be of any suitable magnitude suitable for the specific ionization operation, e.g., a power on the order of 500-3000 watts (W). The pressure in the source chamber can for example be on the order of 1-10 millitorr, so that the source 112 functions as a low pressure, high-density inductive source. The plasma chamber 122 may also include a magnetic filter assembly 440 extending through a region of the chamber interior between the antenna 430 and the aperture plate 146.

The antenna 430 can be positioned within the plasma chamber 122 by a removable support plate 450. The support plate 450 is supported by the side wall 414 at a location having a circular cutout 452 through which the antenna extends. A support plate 450 for the antenna 430 is sized to fit within the cutout 452 in the chamber wall 414 while positioning the exposed U-shaped metal portion 432 of the antenna 430 within the ionization zone 420.

The support plate 450 defines two through passageways that accommodate two vacuum pressure fittings 456. After elongated leg segments 457 of the antenna 430 are pushed through the fittings, end caps 458 are screwed onto the fittings to seal the region of contact between the fittings 456 and the leg segments 457. The antenna 430 is preferably U-shaped in its radiation-emitting region and may for example be constructed from aluminum. The tube has an outer diameter dimensioned to pass through the pressure fittings 456. While in use the antenna absorbs the heat from its surroundings. To dissipate this heat a coolant is routed through the center of the tube.

The plate 450 has a generally planar surface 460 that is exposed to an interior of the plasma chamber and includes a parallel outer surface 462 that faces away from the chamber interior. A flanged portion 464 of the plate 450 overlies a ring magnet 470 that surrounds the cutout in the wall 414 and that is attached to the wall 414 by connectors 472. A ferromagnetic insert 474 attached to the support plate 450 fits over the magnet 470 so that as the plate 450 is positioned within the cutout 452, the ferromagnetic insert 474 and the magnet 470 attract each other to secure the plate 450 in position with the antenna 430 extending into the chamber interior.

During operation of the ion source, heat is generated and this heat is absorbed by the walls 412, 414, 416, 418. The absorbed heat can be removed from the chamber 122 by a coolant that is introduced through a fitting 476 for routing water into a passageway through the walls and away from the chamber by a second exit fitting (not shown). By this arrangement, the temperature of the walls may be maintained at temperature below 100° C., so that the ion source 112 functions as a cold walled ion source.

A region of the antenna 430 near the support plate 450 is particularly susceptible to coating with sputtered material during operation of the ion implanter. To minimize the effect of such sputtering, two shields 480 can be slipped over the aluminum antenna before the antenna is inserted into the support plate 450. These shields are preferably constructed from aluminum and are maintained in place by a friction fit between the shields and the outer surface of the exposed aluminum of the antenna 430.

During operation of the ion source 112, deposits of dopant elements may form on the interior walls 412, 414 and 416 that bound the ionization zone 420. The present disclosure contemplates flowing a co-gas or cleaning gas simultaneously with the source gas while the ion source 112 is operated under normal operating conditions. A cleaning gas source 482 and a corresponding mass flow controller 484 may be provided, with the cleaning gas output of the mass flow controller 484 being combined with the source gas output of the mass flow controller 168 in conduit 170 prior to being delivered to the plasma chamber 122. Alternatively, the source gas and the cleaning gas may be delivered separately to the plasma chamber.

It will be recognized that the source 166 may contain the dopant source material in combination with cleaning material and/or other materials, such as diluents, equilibrium-directing materials, reactants, coolants, etc. Alternatively, the source 482 may contain cleaning material in combination with any one or more of such other materials, e.g., diluents, equilibrium-directing materials, reactants, coolants, etc. Any such supplemental materials may be supplied to the ion source and/or associated flow circuitry, using any suitable arrangement of source vessels and/or other supply equipment components.

Thus, cleaning material, e.g., cleaning gas, may be supplied from a same or a different source vessel in relation to the source vessel supplying the dopant source material, for co-flow of the dopant source material and cleaning material to the ion source chamber.

By co-flow of a cleaning gas through the ion source with the dopant gas, a separate cleaning step is avoided through the in-process use of a cleaning gas. By "in-process" it is understood that the cleaning process occurs while the ion implanter is undergoing normal production operation.

Such in-process cleaning with co-flow of cleaning vapor can be used to effectively remove deposits attributable to thermal decomposition of implant dopant vapor or other ion source feed material, particularly in especially hot areas of the ion source. As an example, during use of $B_2F_4$ for generation of B+ ion beams, deposits may occur in the gas tube feeding the dopant material into the ion source. Such deposits are concentrated at the hot end of the tube where it attaches to the ion source arc chamber, and result from thermal decomposition of $B_2F_4$ to form solid boron or higher boron fluoride mixtures of the general formula $B_xF_y$, where $x<y/2$. These deposits pose a serious operating occurrence, since such deposits can build up and eventually cause failure of the ion source.

The disclosure, in various aspects thereof, provides additional methods for combating and minimizing the amount of deposited material in the ion source and associated flow passages, that can be used in combination with, or as an alternative to, use of a cleaning gas.

In one such aspect, the mechanical design of the tube is modified to minimize thermal heat transfer (conductive and radiative) from the arc chamber to the gas feed tube, thereby minimizing the temperature of the tube and consequently minimizing thermal decomposition.

In another aspect, a cleaning vapor is co-flowed into the ion source together with the $B_2F_4$ gas. The cleaning vapor reacts with any solid deposits formed due to decomposition, converting them to vapors that can be pumped away, thereby avoiding premature failure of the ion source. The cleaning vapor can be any material that reacts with the deposited material at about the same temperature as the decomposition temperature of the dopant vapor. Preferred cleaning vapors include, without limitation, reactive fluorides, such as $XeF_2$ and $NF_3$. Relative flow rates of the cleaning and dopant vapors are advantageously determined by empirical or other means, within the skill of the art, based on the disclosure herein, to establish suitable co-flow conditions for the respective vapors.

Suitable cleaning vapors for such purpose can readily be selected for specific thermally decomposing dopant vapors, to provide a combined flow of dopant vapor and cleaning vapor that is effective for in-situ cleaning of the ion source.

Figure 14:
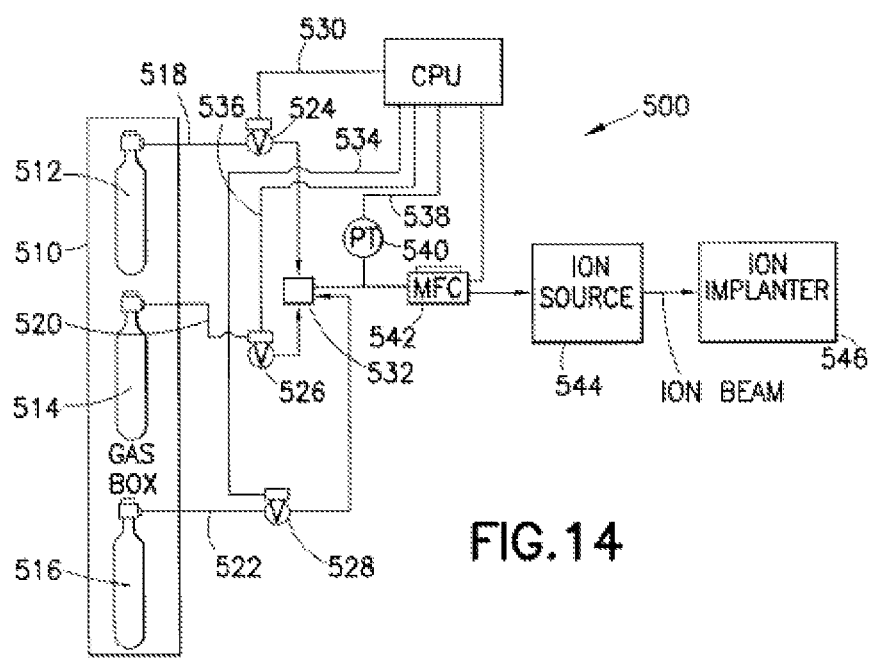
FIG. 14 is a schematic representation of a deposition monitoring and control system that may be usefully employed to combat occlusion of flow passages associated with the ion source of an ion implantation system.

FIG. 14 is a schematic representation of a deposition monitoring and control system that may be usefully employed to combat occlusion of flow passages associated with the ion source 544 of an ion implantation system 500.

As shown, the ion implantation system 500 includes a gas box 510 in which are disposed gas supply cylinders including a dopant source cylinder 512, coupled to dispensing line 518 having flow control valve 524 therein, a cleaning fluid cylinder 514 coupled to dispensing line 520 having a flow control valve 526 therein, and a diluent fluid cylinder 516 coupled to dispensing line 522 having flow control valve 528 therein.

The valves 524, 526 and 528 are connected to a central processing unit (CPU) by signal transmission lines 530, 536 and 534, respectively, whereby the CPU can operate to open or close the respective valves to a specific extent in response to a cycle time program, or other signal generating capability of the CPU that provides a valve-modulating response to process conditions and/or components monitored by the CPU.

The dispensing lines 518, 520 and 522 coupled to the respective cylinders terminate at a mixing chamber 532, so that multiple ones of the respective dopant source, cleaning fluid and diluent fluid can be selectively mixed with one another, as desired. Alternatively, a single cylinder may be arranged to dispense its contents to chamber 532, for flow therefrom to the feed line containing pressure transducer 540 and mass flow controller (MFC) 542 therein, and thence to the ion source 544. The ion source 544 is arranged for ionization operation, to ionize the dopant source therein, and produce an ion beam that is transmitted to the ion implanter chamber 546. The ion implanter chamber 546 contains a semiconductor or other microelectronic device substrate mounted therein for implantation of the selected ionized dopant species in the substrate.

In this illustrative system, the pressure transducer 540 in the feed line to the ion source is joined in signal transmission relationship to the CPU by signal transmission line 538. The mass flow controller also is joined in signal transmission relationship to the CPU by a signal transmission line. By this arrangement of the pressure transducer, a signal is generated that is correlative of the pressure in the feed line, and transmitted in line 538 to the CPU for monitoring purposes.

If during the flow of dopant source material to the ion source, dopant material decomposes in the feed line, e.g., due to heat propagation in such line from the ion source, and accretion of deposited material causes the pressure in the feed line to increase as a result of reduced conductance in the feed line from the build-up of solid deposits, the resulting pressure increase can be sensed by the pressure transducer 540 and transmitted in signal transmission line 538 to the CPU.

The CPU then responsively can initiate action to mitigate the incipient occlusive action of the deposits in the feed line. For example, the CPU can flow the cleaning fluid into the feed line from cylinder 514 by opening the flow control valve 526 by a control signal sent to the valve in signal transmission line 536. Alternatively, the arc power to the ion source could be reduced. As a still further alternative, the residence time of the dopant source could be reduced by increasing the flow rate of the dopant source, by opening of valve 524 by control signal transmitted in signal transmission line 530 to the valve, and/or by adding cleaning fluid and/or diluent fluid so that overall increase in volumetric flow rate causes the residence time of the dopant source in the flow circuitry and ion source to be reduced.

In this manner, the pressure monitoring afforded by the pressure transducer and CPU provides an early onset deposition detection capability in the system, with the capacity to responsively modulate the system to combat such solids deposition in the system.

Deposition of solids deriving from the dopant source can also be detected in the system by the mass flow controller 542.

As deposition occurs during system operation, the valve position on the mass flow controller will open to a greater extent in order to maintain a predetermined flowrate. Such mass flow controller valve position is typically available as a voltage output from the mass flow controller, and such voltage output is transmitted as a monitoring signal in the associated signal transmission line to the CPU.

In response to the increasingly open valve position of the mass flow controller attributable to the progressive buildup of decomposition solids deriving from the dopant source material, the CPU can actuate the same remedial action as described above in connection with the pressure transducer monitoring of the feed line to the ion source.

Thus, the disclosure contemplates in one aspect the provision of a pressure monitoring device that provides an output correlative of solids deposition in the ion source feed line or other passages associated with the ion source, to provide an early warning that a clog may form soon, so that remedial action can be taken to suppress solids accumulation.

Figure 15:
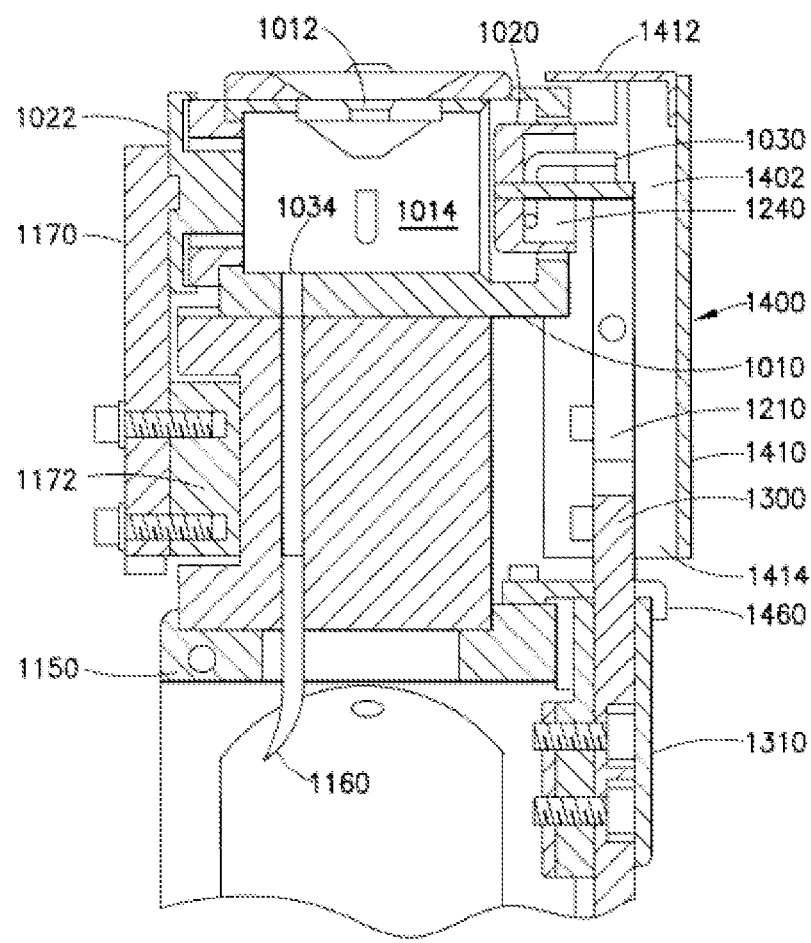
FIG. 15 is a schematic representation of another ion source of an ion implantation system.

FIG. 15 is a schematic representation of another ion source of an ion implantation system.

FIG. 15 is a cross-sectional elevation view of an indirectly heated cathode (IHC) ion source according to one embodiment that may be usefully employed in the practice of the disclosure, showing the arc chamber and related components. Such type of ion source is more fully described in U.S. Pat. No. 7,138,768 to Maciejowski et al.

In this IHC ion source, an the arc chamber housing 1010 having an extraction aperture 1012 defines an arc chamber 1014. A cathode 1020 and a repeller electrode 1022 are positioned within the arc chamber 1014. A filament 1030, positioned outside arc chamber 1014 in close proximity to cathode 1020, produces heating of the cathode. A gas to be ionized is provided from a gas source to arc chamber 1014 through a gas inlet 1034. In another configuration, not shown, arc chamber 1014 may be coupled to a vaporizer which vaporizes a material to be ionized in arc chamber 1014.

An arc power supply has a positive terminal connected to arc chamber housing 1010 and a negative terminal connected to cathode 1020. Repeller electrode 1022 can be floating or can be connected to the negative terminal of arc power supply. The arc power supply may have a rating of 100 volts at 25 amperes and may operate at about 70 volts. The arc power supply accelerates electrons emitted by cathode 1020 into the plasma in arc chamber 1014.

A bias power supply having a positive terminal is connected to cathode 1020 and a negative terminal connected to filament 1030. The bias power supply may have a rating of 600 volts at 4 amperes and may operate at a current of about 2.5 amperes and a voltage of about 350 volts. The bias power supply accelerates electrons emitted by filament 1030 to cathode 1020 to produce heating of cathode 1020.

A filament power supply has output terminals connected to filament 1030. The filament power supply may have a rating of 6 volts at 200 amperes and may operate at a filament current of about 140 to 170 amperes. The filament power supply produces heating of filament 1030, which in turn generates electrons that are accelerated toward cathode 1020 for heating of cathode 1020.

A source magnet produces a magnetic field within the arc chamber 1014. Typically, the source magnet includes poles at opposite ends of arc chamber 1014. The direction of the magnetic field may be reversed without affecting operation of the ion source. The source magnet is connected to a magnet power supply, which may have a rating of 20 volts at 60 amperes. The magnetic field produces increased interaction between electrons emitted by cathode 1020 and the plasma in arc chamber 1014.

It will be understood that the voltage and current ratings and the operating voltages and currents of the various power supplies are given by way of example only.

An extraction electrode and a suppression electrode are suitably positioned in front of extraction aperture 1012. Each of extraction electrode and suppression electrode has an aperture aligned with extraction aperture 1012 for extraction of a well-defined ion beam. The extraction electrode and suppression electrode are connected to respective power supplies.

An ion source controller can be utilized to provide control of the ion source through an isolation circuit. In other embodiments, circuitry for performing the isolation function may be built into power supplies. The ion source controller may be a programmed controller or a dedicated special purpose controller. In one embodiment, the ion source controller is incorporated into the main control computer of an ion implanter.

When the ion source is in operation, the filament 1030 is heated resistively by filament current to thermionic emission temperatures, which may be on the order of 2200° C.

Electrons emitted by filament 1030 are accelerated by the bias voltage VB between filament 1030 and cathode 1020 and bombard and heat cathode 1020. The cathode 1020 is heated by electron bombardment to thermionic emission temperatures. Electrons emitted by cathode 1020 are accelerated by the arc voltage and ionize gas molecules from the gas source within arc chamber 1014 to produce a plasma discharge. The electrons within arc chamber 1014 are caused to follow spiral trajectories by the magnetic field. Repeller electrode 1022 builds up a negative charge as a result of incident electrons and eventually has a sufficient negative charge to repel electrons back through the arc chamber 1014, producing additional ionizing collisions.

The arc chamber 1010 is supported by an ion source body 1150 and an arc chamber base. A plate, which is part of ion source body 1150, defines a boundary between the vacuum region of the ion source and the external environment. A tube 1160 provides a connection between the gas inlet 1034 of the arc chamber 1014 and the gas source.

The repeller electrode 1022 is mounted to the arc chamber base by a conductive support member 1170 and an insulator 172. The repeller electrode 22 is electrically isolated from arc chamber 1010 by an insulator.

The cathode assembly includes cathode 1020, filament 1030 and a clamp assembly 1210 for mounting cathode 1020 and filament 1030 in a fixed spatial relationship and for conducting electrical energy to cathode 1020 and filament 1030. The cathode 1020 is mounted in an opening at one end of arc chamber housing 1010 but does not physically contact arc chamber housing 1010. Preferably, a gap between cathode 1020 and arc chamber housing 1010 is on the order of about 0.050 inch.

There is a gap between the cathode 1020 and the arc chamber housing 1010. The heating loop of filament 1030 is located within the cup-shaped cavity 1240 and migration of the plasma from arc chamber 1014 to filament 1030 is minimal.

The ion source may further include a shield 1400. Shield 1400 substantially encloses a region 1402 outside arc chamber 1014 in proximity to cathode 1020 and filament 1030. A function of shield 1400 is to form a barrier to electrons and plasma in the vicinity of cathode 1020 and filament 1030. The shield 1400 substantially encloses region 1402 in the sense that it forms a barrier to electrons and plasma but does not seal region 1402.

The shield 1400 may have a box-like structure and may be fabricated of a refractory metal. The shield 1400 includes a two-level main wall 1410, a top wall 1412, a first side wall 1414 and a second side wall (not shown). The two-level main wall 1410 permits shield 1400 to be electrically and mechanically connected to a filament clamp but to be spaced from cathode clamp 1300. It will be understood that different shield configurations may be utilized. For example, shield 1400 may have a flat main wall and may be mounted to a filament clamp using standoffs. Furthermore, shield 1400 may be mounted to another element of the ion source.

The clamp assembly 1210 may include a cathode clamp 1300, filament clamps, and an insulator block 1310. Cathode clamp 1300 and the filament clamps are mounted in fixed positions to insulator block 1310 and are electrically isolated from each other.

The ion source may further include an insulator shield 1460 between insulator block 1310 and cathode 1020. The insulator shield 1460 may be a refractory metal element attached to ion source body 1150. The insulator shield 1460 has cutouts to provide electrical isolation from cathode clamp 1300 and the filament clamps. The insulator shield 1460 inhibits buildup of deposits on insulator block 1310 which otherwise could produce a short circuit between one or more cathode clamp 1300 and the filament clamps.

FIG. 16 is a is a graph of beam current (mA), as a function of elapsed time (min), for a cleaning operation using $NF_3$ to remove boron residue from surfaces of an ion source chamber, showing that the boron residue can be removed by flowing $NF_3$ vapor. The operational conditions of this test included an $NF_3$ gas flow of 1.5 sccm, arc power of 145 W (arc voltage=100 volts, arc current=1.45 amps), a source beam current of 20 mA, and an extraction voltage of 40 kV. The curves in the graph of FIG. 16 include beam current curves for $BF^{2+}$, $BF^+$, and $B^+$, as a function of time. Evidence of cleaning is observed by the dramatic reduction in these beam currents as the cleaning gas is flowed into the ion source. The cleaning gas effectively reacts with boron residues, creating volatile boron fluoride, which then ionizes in the arc chamber plasma, producing the various beam currents shown in FIG. 16. In addition to the three sets of curves obtained for a source beam current 20 mA, additional $BF^{2+}$ data are shown when the power of the arc chamber is increased to 200 W, producing an associated source beam current of 30 mA. The additional power further assists in enhancing the cleaning effectiveness of the cleaning gas.

In this operational example, $NF_3$ was not co-flowed with $B_2F_4$, but was flowed after a $B_2F_4$ test in which deposits were observed. Removal of the deposits was observed visually, and the observed removal involved decay of the $BF_2+$ and B+ ions (see curves at lower left-hand portion of FIG. 16) that were formed in the ion source from $BF_3$ created by reaction between $NF_3$ and the boron deposits.

The invention claimed is:

1. An ion implantation system, comprising:
an ion source including an arc chamber, arranged to ionize gas therein;
a dopant gas source;
a dopant gas feed line for introducing a dopant gas from the dopant gas source to the arc chamber under conditions producing ionization of the dopant gas; and a cooling structure associated with the dopant gas feed line, and arranged to cool dopant gas in the dopant gas feed line, to thereby combat heating of the dopant gas by heat generated in operation of the arc chamber, and decomposition of the dopant gas resulting from such heat.

2. The ion implantation system of claim 1, wherein the cooling structure includes a cooling passage arranged to cool the dopant gas feed line and dopant gas flowed therethrough.

3. The ion implantation system of claim 2, wherein the dopant gas feed line is arranged at a distal end thereof to discharge dopant gas into the arc chamber, and wherein the cooling passage is positioned at a distal end portion of the dopant gas feed line.

4. The ion implantation system of claim 3, further comprising a water cooling assembly for the ion source, wherein the water cooling assembly is operatively coupled to the cooling passage to flow water therethrough to cool the dopant gas feed line and dopant gas flowed therethrough.

5. The ion implantation system of claim 1, wherein the dopant gas comprises a boron dopant gas.

6. The ion implantation system of claim 5, wherein the boron dopant gas comprises diboron tetrafluoride.

7. The ion implantation system of claim 6, wherein the cooling structure is operative to maintain temperature of diboron tetrafluoride in the dopant feed gas line below 700° C.

8. The ion implantation system of claim 1, wherein the cooling structure comprises a heat sink body including at least one passage therein through which coolant is flowable to effect cooling of the dopant gas, wherein the heat sink body is adapted to be secured to the dopant gas feed line by a mechanical securement.

9. The ion implantation system of claim 8, comprising an ion source cooling flow circuitry through which coolant is circulated, wherein said flow circuitry is coupled in coolant supply relationship to the heat sink body for flow of coolant through said at least one passage therein.

10. The ion implantation system of claim 1, wherein the ion source chamber comprises a base liner having an opening therein in gas flow communication with the dopant feed gas line.

11. The ion implantation system of claim 1, further comprising at least one of a cleaning gas supply, a diluent gas supply, and a supplemental material supply,
wherein when the cleaning gas supply is present, the ion source is arranged to receive cleaning gas from said cleaning gas supply, during receipt by said ion source of said dopant gas from said dopant gas source, and/or when the ion source is not receiving said dopant gas from said dopant gas source,
wherein when the diluent gas supply is present, the ion source is arranged to receive diluent gas from said diluent gas supply during receipt by said ion source of said dopant gas from said dopant gas source, and
wherein when the supplemental material supply is present, the ion source is arranged to receive supplemental material from said supplemental material supply during receipt by said ion source of said dopant gas from said dopant gas source.

12. The ion implantation system of claim 11, wherein: the cleaning gas comprises at least one gas species selected from among XeF2 and NF3; the diluent gas comprises at least one diluent gas species selected from among XeF2, inert gases, noble gases, BF3, H2, Ar, N2, a mixture of Xe and H2, CH4, and NH3; and the supplemental material comprises at least one of a supplemental material effective to shift ionization reaction equilibrium toward B+, hydrogen, methane, and material effective to combat deposition of decomposition species in the arc chamber, in the dopant gas feed line for flowing the dopant gas to the arc chamber, and/or in a region of an interface between the arc chamber and dopant gas feed line.

13. The ion implantation system of claim 1, further comprising at least one of features selected from the group consisting of:
(i) a controller arranged to maintain a predetermined temperature in the arc chamber or in an outside wall thereof, in the dopant gas feed line, or in a region of an interface between the arc chamber and dopant gas feed line, to combat deposition therein;
(ii) the arc chamber being arranged to dissipate heat by radiation heat transfer;
(iii) the arc chamber including heat dissipation extended surface;
(iv) the arc chamber comprising structure formed of tungsten or molybdenum;
(v) the arc chamber and/or a feed tube thereto comprising a deposition-combating coating or shielding;
(vi) the arc chamber being coated, wrapped or covered with a higher emissivity material than material of construction of the arc chamber;
(vii) the arc chamber being formed of at least two materials of construction, and including materials having differing emissivity;
(viii) a controller arranged to maintain process conditions combating deposition in the arc chamber and/or dopant gas feed line;
(ix) the arc chamber comprising at least one graphite wall and/or tungsten wall;
(x) the arc chamber comprising at least one wall having an emissivity of 0.7-0.8;
(xi) the arc chamber comprising at least one wall having an emissivity of 0.1-0.2;
(xii) the arc chamber comprising at least one tungsten wall;
(xiii) a controller arranged to control emissivity in operation of the ion source;
(xix) a controller comprising a cooler;
(xx) a thermally non-conductive adaptor between the dopant gas feed line and arc chamber;
(xxi) a coaxial adaptor between the dopant gas feed line and arc chamber;
(xxii) an adaptor between the dopant gas feed line and arc chamber that is of a different conductivity and/or emissivity than material of construction of at least one of the dopant gas feed line and arc chamber;
(xxiii) a radiation shield between the source tube and arc chamber;
(xxiv) the dopant gas feed line being constructed of material having lower thermal conductivity than material of construction of the arc chamber;
(xxv) the arc chamber comprising cylindrical protrusions, and optionally an adaptor between the dopant gas feed line and arc chamber that is connected to one of said cylindrical protrusions, arranged to provide a molecular flow regime in the protrusion;
(xxvi) the dopant gas feed line comprising a coaxial tube;
(xxvii) the dopant gas feed line having a diameter greater than 0.635 cm; and
(xxviii) multiple inlets for flow of dopant gas into the arc chamber.

14. The ion implantation system of claim 1, wherein a flow passage of the ion implantation system is susceptible to deposition of solids deriving from the dopant gas in operation of the ion implantation system, further comprising a solids deposition monitoring and control system comprising:
a monitoring device arranged to detect and provide an output indicative of accumulation of deposition solids deriving from said dopant gas in the flow passage; and
a control assembly responsive to said output of said monitoring device to modulate operation of the ion implantation system so as to prevent, reduce or reverse said accumulation of deposition solids deriving from said dopant gas in subsequent operation of the ion implantation system.

15. The ion implantation system of claim 14, wherein the solids deposition monitoring and control system is characterized by at least one of the features of:
(i) the monitoring device comprising a pressure transducer arranged to monitor pressure in said flow passage;
(ii) the monitoring device comprising a mass flow controller arranged to output a signal indicative of valve position of the mass flow controller, wherein a valve defining said valve position opens in response to solids accumulation in the flow passage to maintain a predetermined flow rate through the passage;
(iii) the control assembly comprising a flow control valve operable to modulate flow of dopant gas though the flow passage;
(iv) the control assembly comprising a flow control valve operable to modulate flow of a cleaning fluid through the flow passage;
(v) the control assembly comprising a flow control valve operable to modulate flow of a diluent fluid though the flow passage;
(vi) the control assembly being operable to modulate residence time of the dopant gas in the flow passage and/or the ion source of the ion implantation system; and
(vii) the control assembly being operable to modulate power input to the arc chamber of the ion source.

16. A method of implanting ions in a substrate, the method comprising passing a dopant gas from a source of same to an arc chamber of an ion source, under conditions producing ionization of the dopant gas, and cooling the dopant gas prior to entry to the arc chamber, to thereby combat heating of the dopant gas by heat generated in operation of the arc chamber, and decomposition of the dopant gas resulting from such heat.

17. The method of claim 16, wherein the dopant gas is flowed to the arc chamber in a dopant gas feed line arranged at a distal end thereof to discharge dopant gas into the arc chamber, and the dopant gas is cooled at a distal end portion of the dopant gas feed line.

18. The method of claim 17, wherein the cooling comprises flowing coolant medium through a cooling passage arranged to cool the distal end portion of the dopant gas feed line and dopant gas flowed therethrough.

19. The method of claim 16, wherein the dopant gas comprises a boron dopant gas.

20. The method of claim 16, wherein the dopant gas comprises diboron tetrafluoride, and said cooling is operative to maintain temperature of the diboron tetrafluoride in the distal end portion of the dopant gas feed line below 700° C.

21. The method of claim 16, further comprising flowing at least one of a cleaning gas, a diluent gas, and the supplemental material to the arc chamber, wherein the cleaning gas comprises at least one gas species selected from among XeF2 and NF3; the diluent gas comprises at least one diluent gas species selected from among XeF2, inert gases, noble gases, BF3, H2, Ar, N2, and a mixture of Xe and H2, CH4, and NH3; and the supplemental material comprises at least one of a supplemental material effective to shift ionization reaction equilibrium toward B+, hydrogen, methane, and material effective to combat deposition of decomposition species in the arc chamber, in a dopant gas feed line for flowing the dopant gas to the arc chamber, and/or in a region of an interface between the arc chamber and the dopant gas feed line.

* * * * *

UNITED STATES PATENT AND TRADEMARK OFFICE
CERTIFICATE OF CORRECTION

Page 1 of 1

PATENT NO. : 9,111,860 B2
APPLICATION NO. : 14/452192
DATED : August 18, 2015
INVENTOR(S) : Edward E. Jones et al.

It is certified that error appears in the above-identified patent and that said Letters Patent is hereby corrected as shown below:

On the Title Page, Item 71: "Advanced Technology Materials, Inc., Danbury, CT (US)" should be
        -- Entegris, Inc., Billerica, MA (US) --.

On the Title Page, Item 74: "Hulquist, PLLC; Steven J. Hulquist; Rosa Yaghmour" should be
        -- Hultquist, PLLC; Steven J. Hultquist; Rosa Yaghmour --.

Signed and Sealed this
First Day of March, 2016

Michelle K. Lee
*Director of the United States Patent and Trademark Office*